United States Patent
Saha

(10) Patent No.: US 10,862,459 B2
(45) Date of Patent: Dec. 8, 2020

(54) LOW-LOSS VECTOR MODULATOR BASED PHASE SHIFTER

(71) Applicant: ANALOG DEVICES, INC., Norwood, MA (US)

(72) Inventor: Prabir Kumar Saha, Beaverton, OR (US)

(73) Assignee: Analog Devices, Inc., Norwood, MA (US)

( * ) Notice: Subject to any disclaimer, the term of this patent is extended or adjusted under 35 U.S.C. 154(b) by 119 days.

(21) Appl. No.: 16/178,303

(22) Filed: Nov. 1, 2018

(65) Prior Publication Data
US 2020/0144993 A1    May 7, 2020

(51) Int. Cl.
| | |
|---|---|
| H03H 11/16 | (2006.01) |
| H04B 7/06 | (2006.01) |
| H04L 27/20 | (2006.01) |
| H03H 11/20 | (2006.01) |
| H03F 1/02 | (2006.01) |

(Continued)

(52) U.S. Cl.
CPC ......... *H03H 11/16* (2013.01); *H01Q 21/0006* (2013.01); *H03F 1/0211* (2013.01); *H03F 1/0261* (2013.01); *H03F 3/19* (2013.01); *H03H 11/20* (2013.01); *H04B 7/0617* (2013.01);
(Continued)

(58) Field of Classification Search
CPC . H04L 27/362; H04L 27/364; H04L 27/3488; H04L 2027/0016; H04L 2027/0018; H04L 27/0008; H04L 27/2003; H03C 3/40; H03C 7/025; H03C 1/52; H03C 1/542; H03C 3/00; H03C 3/08; H03C 3/403; H03D 7/14; H03D 7/163; H03D 7/168; H03F 1/0294; H03F 1/0211; H03F 2200/451; H03F 3/19; H03F 1/0261; H03H 11/16; H03H 11/20; H04B 7/0663; H04B 7/0617; H01Q 21/0006; H01Q 3/28; H01Q 3/36
USPC ......... 332/107, 145, 103; 329/304; 375/316, 375/324; 455/260
See application file for complete search history.

(56) References Cited

U.S. PATENT DOCUMENTS

| | | |
|---|---|---|
| 4,977,382 A | 12/1990 | Podell et al. |
| 5,119,399 A | 6/1992 | Santos et al. |

(Continued)

OTHER PUBLICATIONS

Chua, M., et al., "1 GHz Programmable Analog Phase Shifter for Adaptive Antennas", IEEE 1998 Custom Integrated Circuits Conference, pp. 71-74.

(Continued)

*Primary Examiner* — Arnold M Kinkead
(74) *Attorney, Agent, or Firm* — Knobbe Martens Olson & Bear, LLP

(57) ABSTRACT

The signal strength of a vector modulator based phase shifter can be increased enabling signals to be received or transmitted over larger distances than existing phase shifters by applying multiple weights to components of a signal. An input signal can be divided into orthogonal components that can be weighted and combined to generate an intermediate signal. A second intermediate signal can be generated by applying complementary weights to the orthogonal component signal. The two intermediate signals can be combined to obtain the phase shifted signal. By combining complementary weighted component signals, a phase shifted signal with improved signal to noise ratio and greater signal strength can be generated.

20 Claims, 11 Drawing Sheets

(51) Int. Cl.
*H04L 27/36* (2006.01)
*H01Q 21/00* (2006.01)
*H03F 3/19* (2006.01)

(52) U.S. Cl.
CPC ....... *H04B 7/0663* (2013.01); *H04L 27/2003* (2013.01); *H04L 27/362* (2013.01)

(56) References Cited

U.S. PATENT DOCUMENTS

| | | | | |
|---|---|---|---|---|
| 5,694,093 | A * | 12/1997 | DaSilva | H03C 1/52 332/103 |
| 5,923,223 | A * | 7/1999 | Termerinac | H04L 27/2082 329/304 |
| 6,046,649 | A * | 4/2000 | Lange | H03F 1/0294 332/103 |
| 6,417,712 | B1 | 7/2002 | Beards et al. | |
| 6,853,691 | B1 | 2/2005 | Kim | |
| 2013/0120190 | A1 | 5/2013 | McCune, Jr. | |
| 2019/0089308 | A1* | 3/2019 | Kanar | H03F 3/45089 |

OTHER PUBLICATIONS

Kumar, M., et al.. "Broad-Band Active Phase Shifter Using Dual-Gate MESFET", IEEE Transactions on Microwave Theory and Techniques, vol. MTT-29, No. 10, Oct. 1981, pp. 1098-1102.
Soer, M.C.M., et al., "Beamformer With Constant-Gm Vector Modulators and Its Spatial Intermodulation Distortion", IEEE Journal of Solid-State Circuits, vol. 52, No. 3, Mar. 2017, pp. 735-746.

* cited by examiner

LOW-LOSS VECTOR MODULATOR BASED PHASE SHIFTER

FIELD OF THE DISCLOSURE

The described technology generally relates to phase shifters, more specifically, to a vector modulator based phase shifter.

BACKGROUND

There are circumstances where it is desirable to change the phase of a signal. A phase shifter is one component included in certain electrical systems that may change the phase of the signal. The phase shifter can be used to control the relative phase of each element in a phase array antenna to help change the direction of transmit or receive signals. The phase shifter can also be used in cancellation loops in high linearity amplifiers or for transmit leakage compensation circuits.

Changing the direction of propagation of a signal can be useful in many applications. For example, it is often desirable to transmit a signal in a particular direction. By changing the direction of propagation of a signal, it is possible to transmit the signal in the desired direction without moving an antenna. Thus, it is possible to, for example, scan an object, such as a human, or transmit different signals in different directions without physically moving an antenna.

Certain embodiments of the present disclosure relate to a phase shifter with signal loss compensation. The phase shifter may include: a splitter configured to split an input signal into a first signal (I signal) and a second signal (Q signal) that has a 90 degree phase difference from the first signal; scaling circuitry configured to split the I signal into a first scaled I signal that is scaled by a first scaling factor and a second scaled I signal that is scaled by a second scaling factor, and to split the Q signal into a first scaled Q signal scaled by a third scaling factor and a second scaled Q signal scaled by a fourth scaling factor; and combining circuitry configured to combine the first scaled I signal, the first scaled Q signal, the second scaled I signal, and the second scaled Q signal to generate an output signal corresponding to a phase-shifted version of the input signal.

Additional embodiments of the present disclosure relate to a method of compensating for signal loss when modifying a phase of an input signal using a phase shifter. The method may include: splitting an input signal into an in-phase (I) signal and a quadrature-phase (Q) signal; scaling the I signal by a first scaling factor to obtain a first scaled I signal and by a second scaling factor to obtain a second scaled I signal; scaling the Q signal by a third scaling factor to obtain a first scaled Q signal and by a fourth scaling factor to obtain a second scaled Q signal; and combining the first scaled I signal, the first scaled Q signal, the second scaled I signal, and the second scaled I signal to obtain an output signal, wherein the output signal comprises a phase-shifted version of the input signal.

Some additional embodiments of the present disclosure relate to a wireless device configured to transmit and receive radio frequency (RF) signals. The wireless device may include an antenna array comprising one or more antennas configured to transmit an RF signal; and a transmitter configured to generate the RF signal for transmission by the antenna array, the transmitter comprising a phase shifter configured to modify a phase of a communication signal. The phase shifter may comprise: a splitter configured to split the communication signal into an in-phase (I) signal and a quadrature-phase (Q) signal; scaling circuitry configured to generate a first scaled I signal by scaling the I signal by a first scaling factor and a second scaled I signal by scaling the I signal by a second scaling factor, and to generate a first scaled Q signal by scaling the Q signal by a third scaling factor and a second scaled Q signal by scaling the Q signal by a fourth scaling factor; and combining circuitry configured to combine the first scaled I signal, the first scaled Q signal, and the second scaled I signal, and the second scaled Q signal to generate a phase-shifted version of the communication signal.

SUMMARY OF THE DISCLOSURE

The systems, methods and devices of this disclosure each have several innovative aspects, no single one of which is solely responsible for the all of the desirable attributes disclosed herein. Details of one or more implementations of the subject matter described in this specification are set forth in the accompanying drawings and the description below.

The signal strength of a vector modulator based phase shifter can be increased enabling signals to be received or transmitted over larger distances than existing phase shifters by applying multiple weights to components of a signal. An input signal can be divided into orthogonal components that can be weighted and combined to generate an intermediate signal. A second intermediate signal can be generated by applying complementary weights to the orthogonal component signal. The two intermediate signals can be combined to obtain the phase shifted signal. By combining complementary weighted component signals, a phase shifted signal with improved signal to noise ratio and greater signal strength can be generated.

Certain embodiments of the present disclosure relate to a phase shifter. The phase shifter may include signal loss compensation. Further, the phase shifter may include: a splitter configured to split an input signal into a first signal (I signal) and a second signal (Q signal) that has a 90 degree phase difference from the first signal; scaling circuitry configured to split the I signal into a first scaled I signal that is scaled by a first scaling factor and a second scaled I signal that is scaled by a second scaling factor, and to split the Q signal into a first scaled Q signal scaled by a third scaling factor and a second scaled Q signal scaled by a fourth scaling factor; and combining circuitry configured to combine the first scaled I signal, the first scaled Q signal, the second scaled I signal, and the second scaled Q signal to generate an output signal corresponding to a phase-shifted version of the input signal.

Additional embodiments of the present disclosure relate to a method of compensating for signal loss when modifying a phase of an input signal using a phase shifter. The method may include splitting an input signal into an in-phase (I) signal and a quadrature-phase (Q) signal; scaling the I signal by a first scaling factor to obtain a first scaled I signal and by a second scaling factor to obtain a second scaled I signal; scaling the Q signal by a third scaling factor to obtain a first scaled Q signal and by a fourth scaling factor to obtain a second scaled Q signal; and combining the first scaled I signal, the first scaled Q signal, the second scaled I signal, and the second scaled I signal to obtain an output signal, wherein the output signal comprises a phase-shifted version of the input signal.

Some embodiments of the present disclosure relate to a wireless device configured to transmit and receive radio frequency (RF) signals. The wireless device may include an antenna array comprising one or more antennas configured to transmit an RF signal; and a transmitter configured to generate the RF signal for transmission by the antenna array, the transmitter comprising a phase shifter configured to modify a phase of a communication signal. The phase shifter may include a splitter configured to split the communication signal into an in-phase (I) signal and a quadrature-phase (Q) signal; scaling circuitry configured to generate a first scaled I signal by scaling the I signal by a first scaling factor and a second scaled I signal by scaling the I signal by a second scaling factor, and to generate a first scaled Q signal by scaling the Q signal by a third scaling factor and a second scaled Q signal by scaling the Q signal by a fourth scaling factor; and combining circuitry configured to combine the first scaled I signal, the first scaled Q signal, and the second scaled I signal, and the second scaled Q signal to generate a phase-shifted version of the communication signal.

BRIEF DESCRIPTION OF THE DRAWINGS

Throughout the drawings, reference numbers are re-used to indicate correspondence between referenced elements. The drawings are provided to illustrate embodiments of the subject matter described herein and not to limit the scope thereof.

DETAILED DESCRIPTION

Figure 1A:
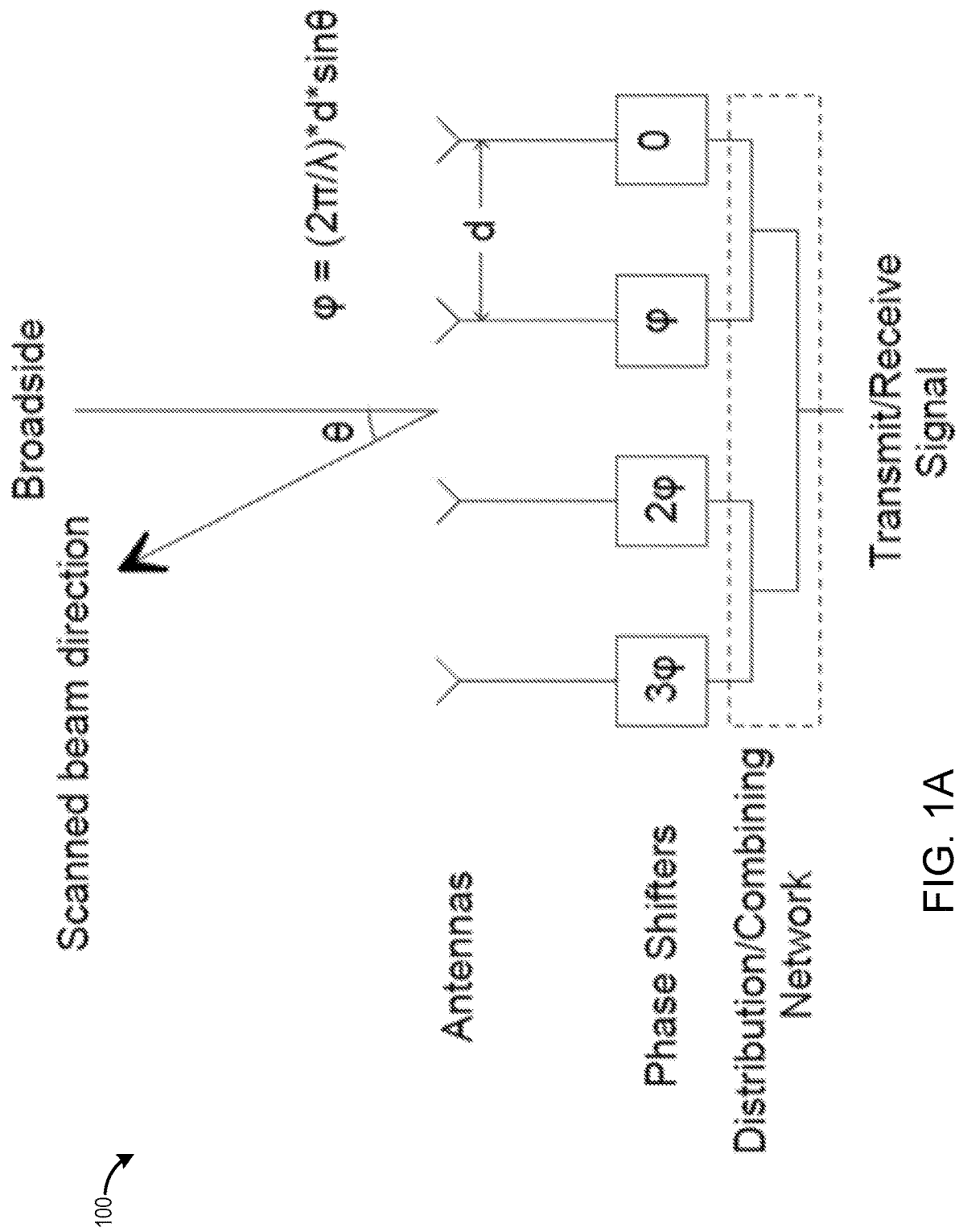
FIG. 1A illustrates an example of a phased array including a plurality of phase shifters.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

As previously described, it is often desirable to change the phase of a signal, such as a radio frequency (RF) signal, in order to change the propagation direction of the signal in a phased array. One method of altering the phase of a signal is to use a phase shifter. There are a number of implementations for a phase shifter.

In a phased array, signals to/from multiple antennas may be phase-shifted with respect to each other so that they may combine in-phase when transmitting/receiving in/from a particular direction. FIG. 1A shows an illustration of an example transmit array 100. A power distribution network may distribute the transmit signal to the array of phase shifters, which can shift the phases of each individual signal and then provide the phase-shifted signals to the array of antennas. The incremental phase shift $\Delta\varphi$ and the physical distance d between the adjacent antennas can be used to determine the transmit beam direction.

The incremental phase shift $\Delta\varphi$ (which is sometimes referred to as $\varphi$) may be defined as the phase difference between the output of adjacent phase shifters rather than a difference between the output and input of a phase shifter. In certain embodiments, when characterizing a phase shifter, any one of the output phase states can be taken as a reference and all other phase states can be measured with respect to that reference. For example, an output phasor corresponding to a full-scale I-component (e.g., 1*the I-component on a scale of 0 to 1) and a zero Q-component (e.g., 0*the Q-component on a scale of 0 to 1) may be taken as the output reference. Further, in certain embodiments, it may be assumed that the magnitude of the reference phasor is 1 and the scaling factors x and y may have values in between 0 and 1 depending on the desired phase shift $\varphi$ with respect to the reference state.

One example of a phase shifter is a vector modulator based phase shifter. A vector modulator based phase shifter can divide a signal that is to be shifted into two orthogonal components. These orthogonal components may be referred to as 'I' and 'Q' signals or signal components. Further, the I component may be referred to as an "in-phase" component and the Q component may be referred to as a "quadrature" component. Regardless of terminology, the I and Q components are typically a pair of sinusoid signals that are 90 degrees out of phase. The separate I and Q signal components may be individually scaled and then recombined to produce an output signal. The scaling, or weighting, function applied to the I and Q signal components may cause the recombined output signal to be shifted in phase compared to the original received signal.

Figure 1B:
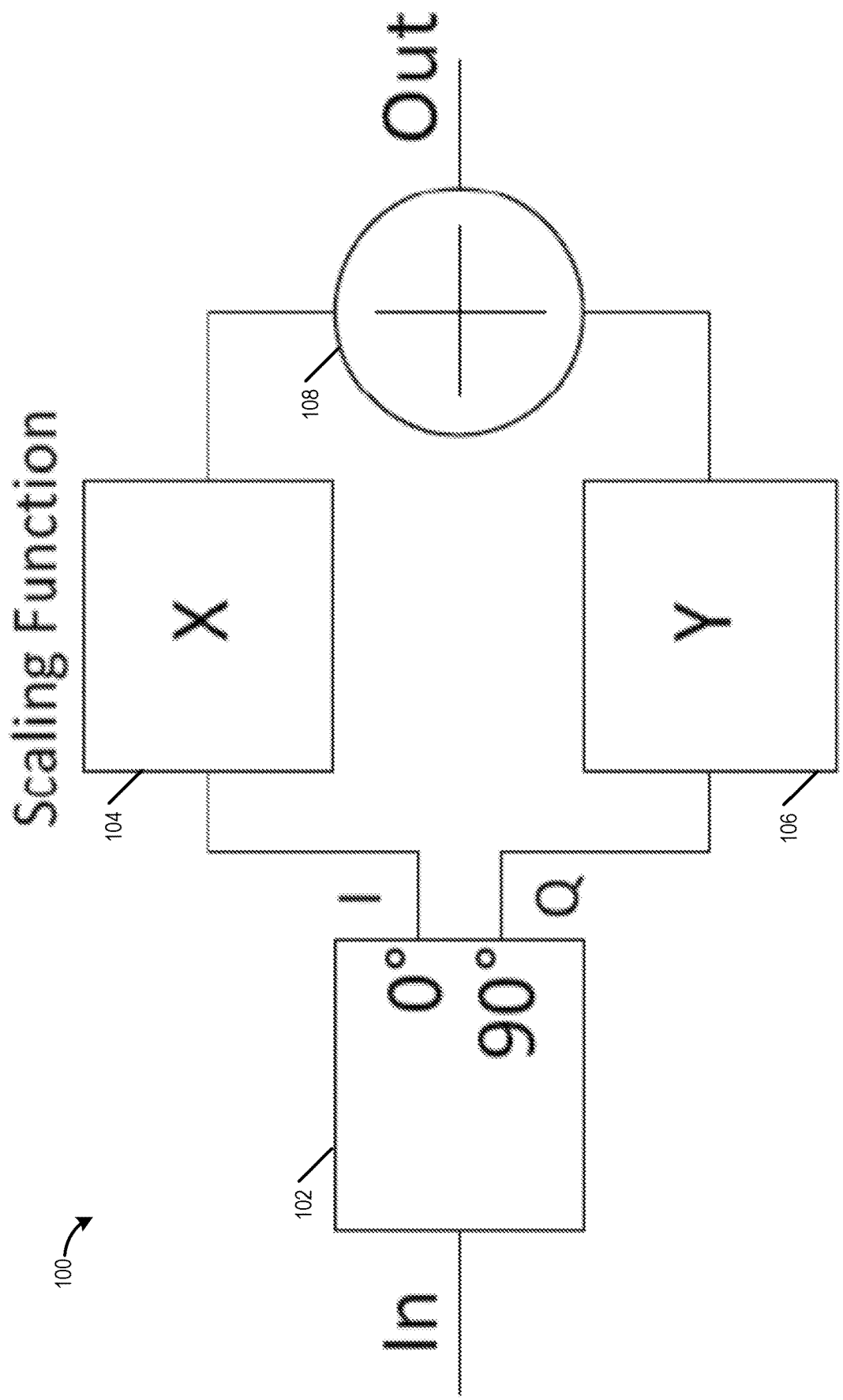
FIG. 1B illustrates an example of a vector modulator phase shifter.

One example of a vector modulator based phase shifter 120 is illustrated in FIG. 1. To simplify discussion and not to limit the present disclosure, the vector modulator based phase shifter 120 may be referred to as a phase shifter 120 herein. The phase shifter 120 may include a 90° splitter 102 that can split an input signal into I and Q components that are orthogonal to each other. The I component may be scaled by a scaling circuit 104, which may also be referred to as a weighting circuit 104, that implements a scaling function. Similarly, the Q component may be scaled by a scaling circuit 106, which may also be referred to as a weighting circuit 106, that implements a scaling function. The scaling circuits 104 and 106 may implement the same scaling function or may implement different scaling functions. Typically, the scaling or weighting applied to the I and Q components differ. However, in some cases, such as when the phase of a reference state of an output signal matches a desired phase of the output signal, the scaling or weighting applied to the I and Q components may not differ.

In some embodiments, the output phase ($\varphi$) may be measured with respect to a reference state of an output of the phase shifter 120. The output phasor corresponding to full-scale I and zero Q may be used as the reference state. In some embodiments, the magnitude of the reference phasor is 1 and the scaling factors (x and y) may have values between 0 and 1 depending on the desired phase shift ($\varphi$) with respect to the reference state. To vary phase while maintaining constant amplitude, x and y are typically chosen as $\cos(\varphi)$ and $\sin(\varphi)$ respectively.

The different scaling apply to the I and Q components enables the phase shifter 120 to adjust the phase of the resultant signal formed by the combiner 108. The combiner 108 may combine the scaled I and Q components output by the scaling circuit 104 and 106 respectively. The phase of the resultant signal may vary up to 90° from the signal received at the phase shifter 120.

Figure 2:
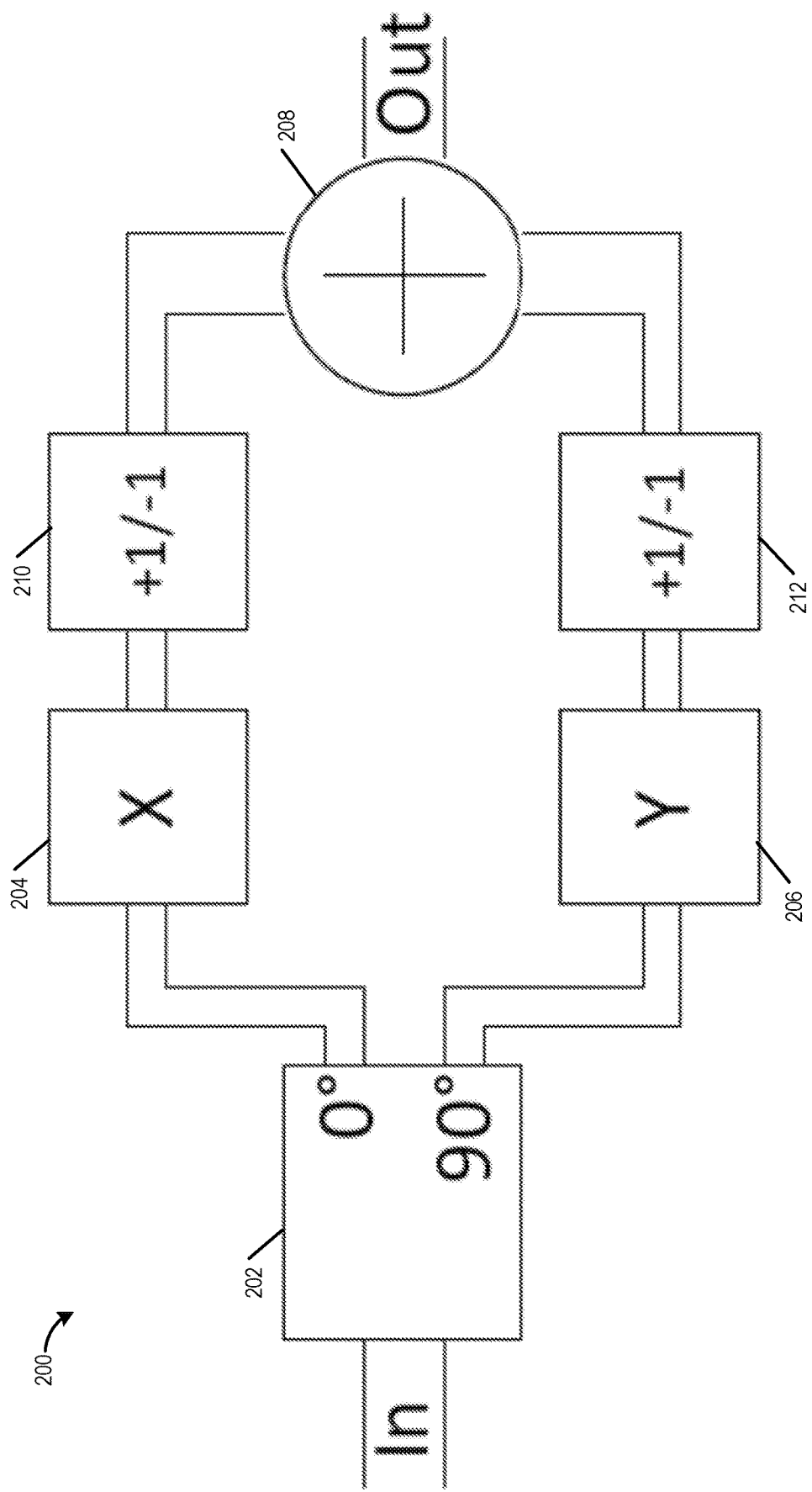
FIG. 2 illustrates an example of a differential signal vector modulator phase shifter.

FIG. 2 illustrates an example of a differential signal vector modulator based phase shifter 200. To simplify discussion and not to limit the present disclosure, the differential signal vector modulator based phase shifter 200 may be referred to as a phase shifter 200 herein. The phase shifter 200 is similar to the phase shifter 120 and may include similar components as the phase shifter 120. However, the input signal to the phase shifter 200 may be a differential signal. The differential signal may use two complementary signals to transmit information. The information may be transmitted based on an electrical difference between the two transmission lines instead of electrical difference between a single transmission line and ground.

As with the phase shifter 120, the phase shifter 200 may include a 90° splitter 202 that can split an input signal, which in the case of FIG. 2 is a differential input signal, into I and Q components that are orthogonal to each other. The I component may be scaled by a scaling circuit 204, which may also be referred to as a weighting circuit 204, that implements a scaling function. Similarly, the Q component may be scaled by a scaling circuit 206, which may also be referred to as a weighting circuit 206, that implements a scaling function. The scaling circuits 204 and 206 may implement the same scaling function or may implement different scaling functions. As with the phase shifter 120, in most cases, the scaling or weighting applied to the I and Q components in the phase shifter 200 differ. Further, as with the phase shifter 120, in some cases, the scaling or weighting applied to the I and Q components may not differ. The different scaling apply to the I and Q components enables the phase shifter 200 to adjust the phase of the resultant signal formed by the combiner 208. The combiner 208 may combine the scaled I and Q components output by the scaling circuit 204 and 206 respectively.

Unlike the example phase shifter 120, the example phase shifter 200 includes inverter circuits 210 and 212. The inverter circuits 210 and 212 can be controlled to invert the output of the scaling circuits 204 and 206. In some embodiments, the inverter circuits 210 and 212 may be implemented using switches that can be used to flip or cross the differential wires to invert the signal carried by the differential wires. As described above, the phase of the resultant signal generated by the phase shifter 120 may vary up to 90° from the signal received at the phase shifter 120. In contrast, by the inclusion of the inverter circuits 210 and 212, the differential output signal of the phase shifter 200 may have a phase difference between 0° and 360° from the differential signal received at the phase shifter 200. In other words, while the phase shifter 120 may adjust the phase of the received signal within a single quadrant (e.g., the first quadrant 302) of a circle, such as that depicted in FIG. 3, the phase shifter 200 may adjust the phase of the received signal to be within any of the four quadrants of the circle.

Figure 3:
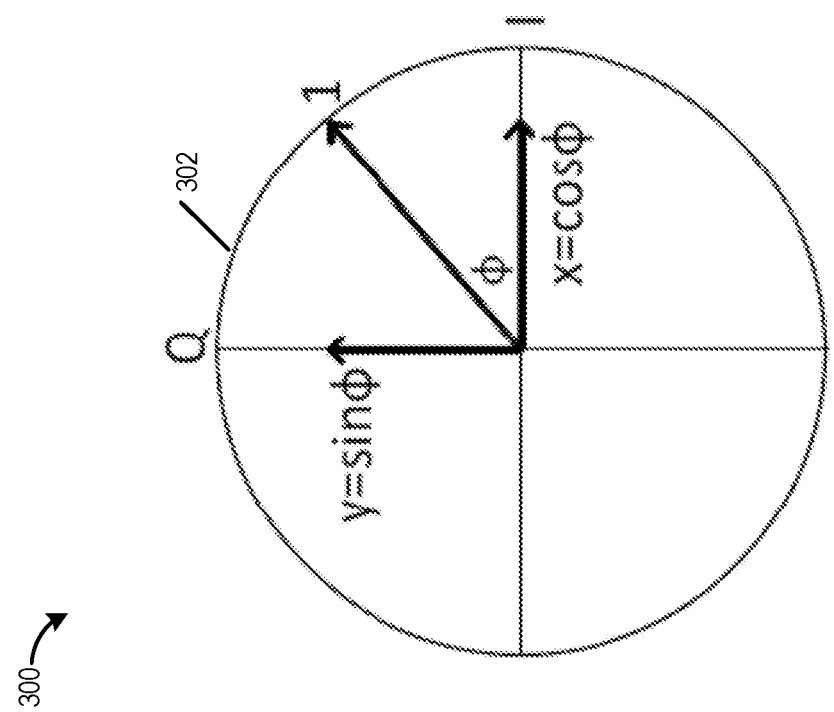
FIG. 3 presents a graph of phasors representing the I-Q components and the output of the vector modulator phase shifter of FIG. 1.

FIG. 3 presents a graph 300 of phasors representing the I-Q components and the output of the vector modulator based phase shifter 120 of FIG. 1. The graph 300 can also represent the output of the phase shifter 200 when the phase shift angle is between 0 and 90 degrees. The desired phase shift angle may be represented by the angle $\Phi$. The weight applied to the I component can thus be calculated by the scaling circuit 104 or 204 as cosine $\Phi$. Similarly, the weight applied to the Q component can be calculated by the scaling circuit 106 or 206 as sine $\Phi$).

Figure 4:
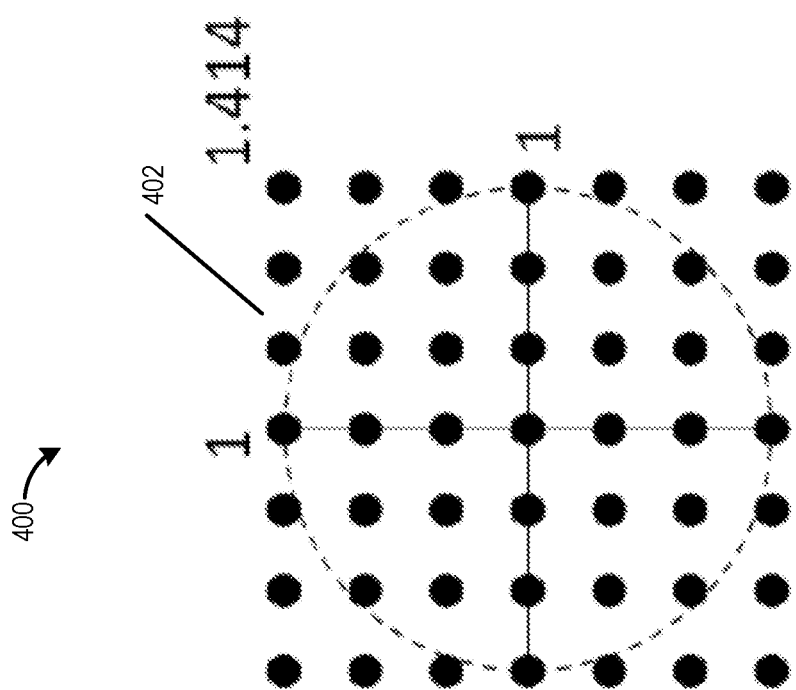
FIG. 4 presents a constellation diagram of amplitudes and phases for the range of output of the vector modulator phase shifter of FIG. 2.

FIG. 4 presents a constellation diagram 400 of amplitudes and phases for the range of output of the vector modulator phase shifter 200 of FIG. 2. In the illustrated example, each scaling factor may be controlled by a 2-bit digital word. The amplitudes and phases for the range of output of the vector modulator phase shifter 200 can be represented by the first quadrant 402 of the constellation diagram 400.

In certain embodiments, only a portion of the received signal that is received by the phase shifters 120 and 200 is used or maintained by the phase shifters when modifying the phase of the received signal. The remaining portion of the received signal that is not used by the phase shifter may be discarded. As a result, the strength or output of the signal from the phase shifter 120 or 200 is reduced. For example, if the desired phase change of a received signal is 90°, the entire I component of the signal is discarded as cosine of 90° equals zero. Although the loss of signal is easier to see with an angle of 90°, should be understood that some portion of signal may be lost with any phase shift angle utilized by the phase shifter 120 or 200. The reduction in strength of the output signal from the phase shifter 120 or 200 can result in a greater impact of noise on the signal. Further, the reduction in strength of the output signal from the phase shifter 120 or 200 can result in a reduced supported transmission distance and/or a reduced receive quality or receive distance for a signal.

Embodiments disclosed herein present a new type of vector modulator based phase shifter that improves the strength of the output of the phase shifter enabling a greater transmission or reception distance for a signal. Further, embodiments of the vector modulator based phase shifter disclosed herein reduce the impact of noise on a signal processed by the phase shifter. In certain embodiments, the phase shifter disclosed herein utilizes the entire received signal without discarding a portion of the received signal enabling the phase shifted output signal to substantially maintain the signal strength of the signal processed by the phase shifter. Ideally, the phase shifter disclosed herein may have a 3 dB improvement over traditional phase shifters. In practice, realization losses in components of the phase shifter disclosed herein (e.g., the phase shifter 500 described below), such as the 90° hybrid of 90° combiner at the output may reduce the improvement somewhat. For example, in certain embodiments, the phase shifter disclosed herein may have a 2.5 dB, 2.75 dB, or 2.8 dB or improvement in signal-to-noise ratio compared to the comparison examples of phase shifters 120 and 200.

Example Full-Signal Vector Modulator Based Phase Shifter

Figure 5:
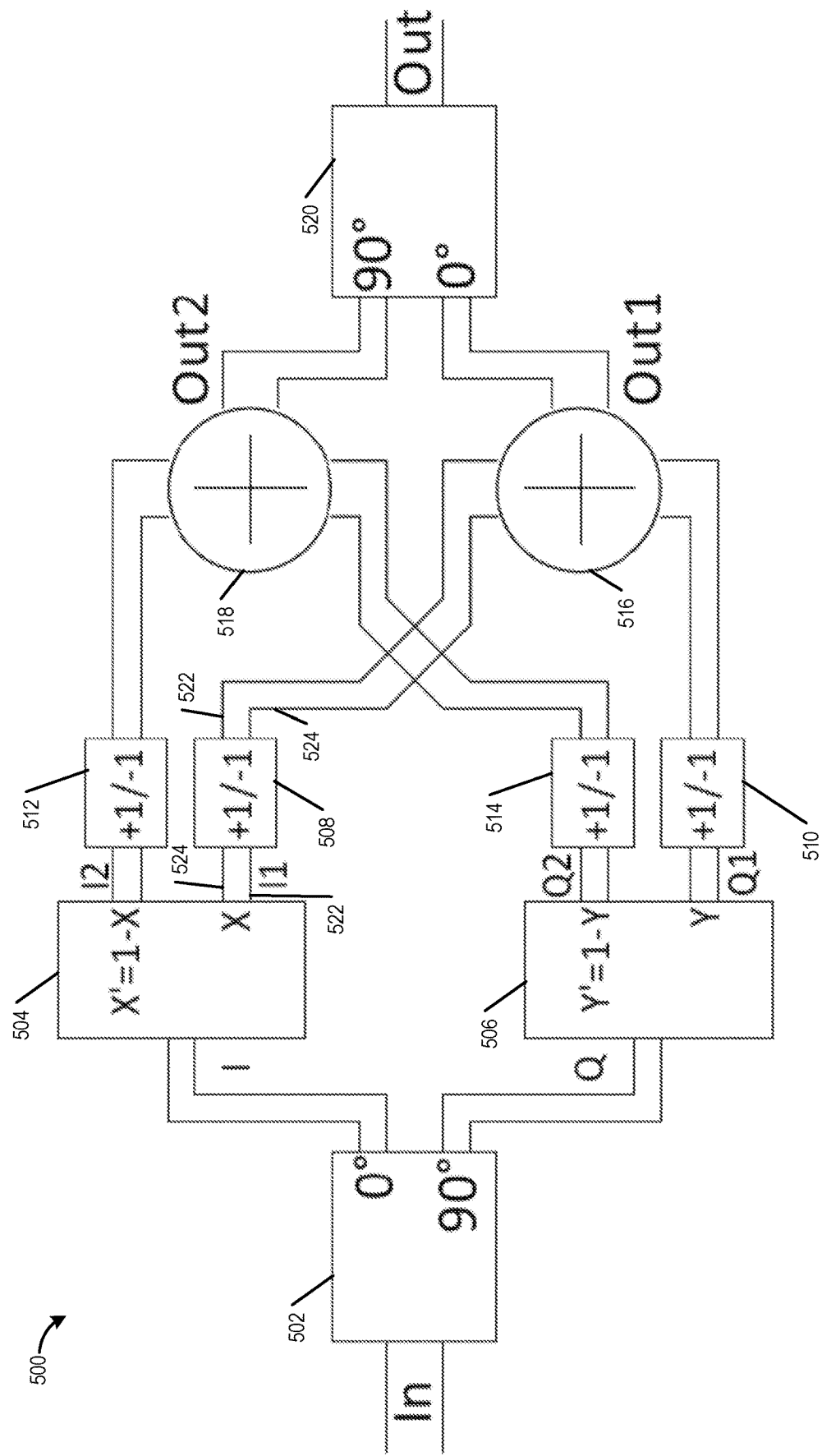
FIG. 5 illustrates an example of a vector modulator based phase shifter in accordance with certain embodiments.

FIG. 5 illustrates an example of a vector modulator based phase shifter 500 in accordance with certain embodiments. To simplify discussion and not to limit the present disclosure, the vector modulator based phase shifter 500 may be referred to as a phase shifter 500 herein. The phase shifter 500 is illustrated as a differential phase shifter that processes a differential signal. However, embodiments of the phase shifter 500 may process a non-differential input signal received over a single input line or communication path.

The phase shifter 500 includes a 90° splitter 502 that can split an input signal into I and Q components that are orthogonal to each other. In certain embodiments, the splitter 502 may split the signal into non-orthogonal components. Although a non 90° splitter may be used in certain embodiments, the efficiency may be reduced in some cases. As illustrated by the two pairs of signal lines, the I and Q components may be maintained as differential signals. However, in certain embodiments, the differential signal lines may be converted into non-differential signals.

The I and Q components may be provided to scaling or weighting circuits 504 and 506, respectively. The scaling circuit 504 may scale the I component to produce a scaled I component, which may be referred to as "I1" and is scaled based on a desired phase shift angle. The desired phase shift angle may be selected based on a control signal to generate an output signal that corresponds to the input signal with a modified phase. In other words, in certain embodiments, the information or data encoded in the input signal may be maintained while the phase of the signal may be modified. Similarly, the scaling component 506 may scale the Q component to produce a scaled Q component, which may be referred to as "Q1" and is scaled based on the desired phase shift angle.

The weights, or scaling, applied to the I and Q components by the scaling circuits 504 and 506 may be determined based on the amount of phase shift in order to adjust a beam direction in a particular direction. The amount of phase shift may vary for different applications. Alternatively, or in addition, the amount of phase shift may be modified continuously or intermittently based on an antenna to receive or transmit a signal, or in order to sweep a signal across a particular area. For example, a controller may cause the phase shifter 500 to sweep a signal phase across a range of phases so as to cause a signal to be transmitted in different directions enabling the signal to be transmitted in different zones without physically moving an antenna. In certain embodiments, the weight applied to the I and Q components in the phase shifter 500 can be determined using the following equations.

$$X = \cos^2 \theta \quad (1)$$

$$Y = \sin^2 \theta \quad (2)$$

$$\theta = a\tan(\sqrt{\tan\varphi}) \quad (3)$$

In equation (1), X represents the weighting or scaling factor applied to the I component of the input signal. Similarly, in equation (2), Y represents the weighting or scaling factor applied to the Q component of the input signal. Further, in equation (3), $\varphi$ represents the desired phase shift of the output signal with respect to a reference state of the phase shifter 500. In certain embodiments, for a particular desired phase shift angle $\varphi$, the weights X and Y calculated by the scaling functions 504 and 506 for weighting the I and Q components, respectively, may differ from the weights calculated by the scaling functions 104/204 and 106/206 for the same phase shift angle.

The scaled signals I1 and Q1 may be provided to a combining network 516 to produce a composite or aggregate signal. This composite signal is identified as Out1 in FIG. 5. In certain embodiments, the desired phase shift angle is greater than 90 degrees. In some such embodiments, it may be desirable to invert the I1 signal or the Q1 signal. The phase shifter 500 may include inverter circuits 508 and 510 that are configured to invert the signals I1 and Q1, respectively, based on the desired phase shift angle. The inverter circuits 508 and 510 may include any type of inverter circuit capable of inverting a differential signal. For example, the inverter circuits 508 and 510 may include switching circuits that can switch or cross the differential signal paths to invert the signal. For example, the inverter circuit 508 can switch the signal path 522 and 524 as illustrated in FIG. 5 to invert the signal I1. The switches may be implemented using one or more transistor networks. In embodiments where the phase shifter 500 is configured to process non-differential signals (e.g., signals that are measured compared to ground), the inverter circuits 508 and 510 may include any type of inverter circuit capable of inverting a non-differential signal. In certain embodiments, by inverting the I1 and Q1 component signals, the phase shifter 500 can modify a polarity or sign (e.g., + or −) of the output signal.

In addition to scaling the I component to create I1, the scaling circuit 504 may apply a different scaling factor to create a second scaled I component signal, which may be referred to as "I2" and is scaled based on a desired phase shift angle. This desired phase shift angle may be the same angle used to create I1. Similarly, in addition to scaling the Q component to create Q1, the scaling circuit 506 may apply a different scaling factor to create a second scaled Q component signal, which may be referred to as "Q2" and is scaled based on a desired phase shift angle. The signal I2 may be obtained by scaling the I component signal by applying a weight X' to the I component signal. The weight X' may equal 1−X where X is obtained using equation (1) above. In some cases, the relationship between X and X' is based on the magnitudes of the scaling factors. Accordingly, in some cases, the magnitude of the scaling factor X' may equal 1 minus the magnitude of the scaling factor X. Thus, in certain embodiments, the weights applied to the I signal component to obtain the signals I1 and I2 may add to one. Similar to I2, the signal Q2 may be obtained by scaling the Q component signal by applying a weight Y' to the Q component signal. The weight Y' may equal 1−Y where Y is obtained using equation (2) above. In some cases, the relationship between Y and Y' is based on the magnitudes of the scaling factors. Accordingly, in some cases, the magnitude of the scaling factor Y' may equal 1 minus the magnitude of the scaling factor Y. Thus, in certain embodiments, the weights applied to the Q signal component to obtain the signals Q1 and Q2 may add to one.

As with the signals I1 and Q1, the signals I2 and Q2 may, in some cases, be inverted based on the particular desired phase shift angle. In such cases, the inverters 512 and 514 may invert the signals I2 and Q2 respectively. The inverters 512 and 514 may include one or more of the embodiments previously described with respect to the inverters 508 and 510, respectively.

In certain embodiments, instead of, or in addition to applying different scaling factors to the I and Q signals, the I and Q signals may be split into two parts, which may each be scaled. For instance, the I component may be split into two parts, I1 and I2 with x and x' being the respective scaling factors. Similarly the Q component may be split into Q1 and Q2 with y and y' being the respective scaling factors.

The weights applied to the I and Q components of the phase shifter 500 can be determined using the equations 1-3 above with x being determined using equation 1 and y being determined using equation 2. In certain embodiments, the scaling factor x' may equal the scaling factor y determined using equation 2. Similarly, in certain embodiments, the scaling factor y' may equal the scaling factor x determined using equation 1.

As stated above, φ may represent the desired phase shift and may be related to the parts of the I and Q components by the following relationships.

$$\text{sign}(I1) = \text{sign}(Q2) = \text{sign}(\cos \varphi) \quad (4)$$

$$-\text{sign}(I2) = \text{sign}(Q1) = \text{sign}(\sin \varphi) \quad (5)$$

The "sign" in the equations 4 and 5 above refer to the phase of the values within the parenthesis. In other words, the "sign" refers to whether the values are positive or negative, and can be used to determine the quadrant of the values. The sign for the components I1 and Q2 may be set based on the sign of the value determined from the cosine of the desired phase shift φp. Similarly, the sign for the components I2 and Q1 may be set based on the sign of the value determined from the sine of the desired phase shift cp. By setting the signs of the components I1, I2, Q1, and Q2, it is possible to control the quadrant in which the output signal of the phase shifter 500 is located.

I1 and Q2 may both be set to have the same sign (e.g., both may be positive or negative), and 12 and Q1 may both be set to have opposite signs (e.g., I2 may be negative when Q1 is positive). Setting the sign of the I1, I2, Q1, and Q2 components may be performed by configuring the inverters 508, 510, 512, and 514 based on the calculations in equations 4 and 5. By modifying the sign of one or more of the I1, I2, Q1, and Q2 components, the phase shifter 500 can adjust the quadrant of the output signal to match the desired quadrant of the graphs illustrated in FIGS. 7 and 8.

By splitting the I and Q components into two components that are scaled and then recombined, no part of the signal is lost or discarded resulting in a stronger signal (e.g., a signal with more signal strength compared to traditional designs). The output phasor generated by the relationships in equations 4 and 5 may trace the periphery of the square formed by the constellation in FIG. 8. If a constant output amplitude is desired, the weights or scaling factors may be modified using the following equations.

$$X = \cos^2 \theta * |\cos(\varphi - 45°)| \quad (6)$$

$$Y = \sin^2 \theta * |\cos(\varphi - 45°)| \quad (7)$$

Figure 8:
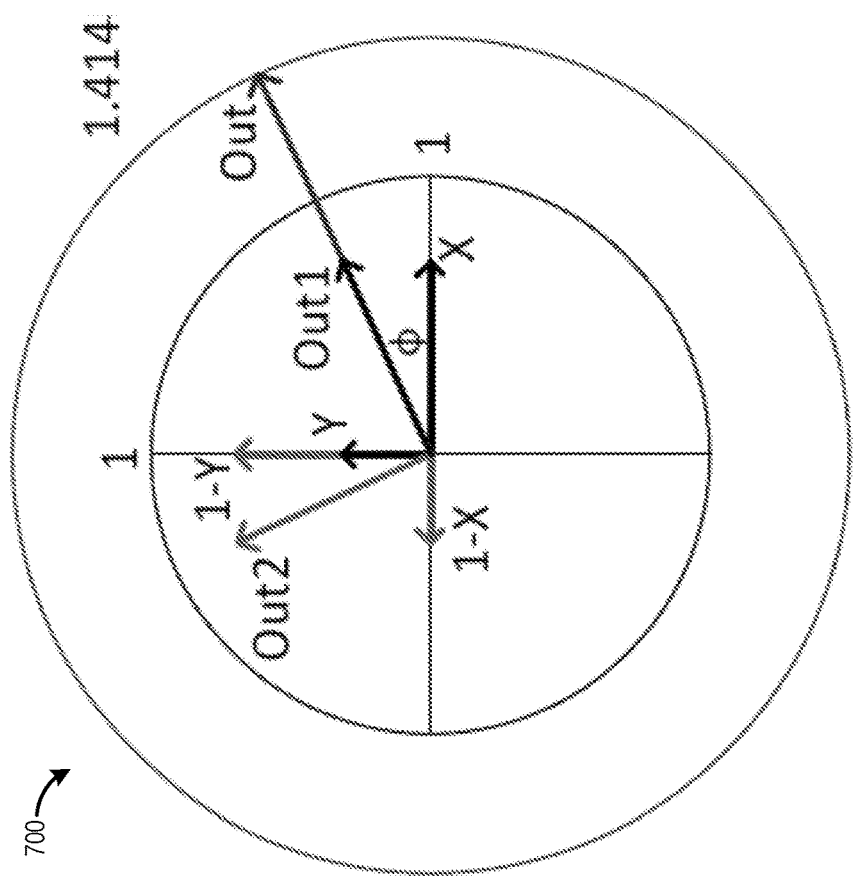
FIG. 8 presents a constellation diagram of amplitudes and phases for the range of output of the vector modulator based phase shifter of FIG. 5.

In the constant output amplitude case, the output phasor may trace the circle 802 of FIG. 8.

The scaled signals I2 and Q2 may be provided to a combining network 518 to produce a composite or aggregate signal. This composite signal is identified as Out2 in FIG. 5. The composite signals Out1 and Out2 may be referred to as intermediate signals and may or may not be output by the phase shifter 500. The combining networks 516 and 518 may include any circuitry that can combine, or otherwise aggregate, two differential signals. Further, in embodiments where the signals are non-differential signals, the combining networks 516 and 518 may include any circuitry that can combine two signals. In some cases, the combining networks 516 and 518 may each be a node that combines two wires together causing the signals carried by the wires to be added. In certain embodiments, a Wilkinson combiner may be used to combine the signals.

Figure 6B:
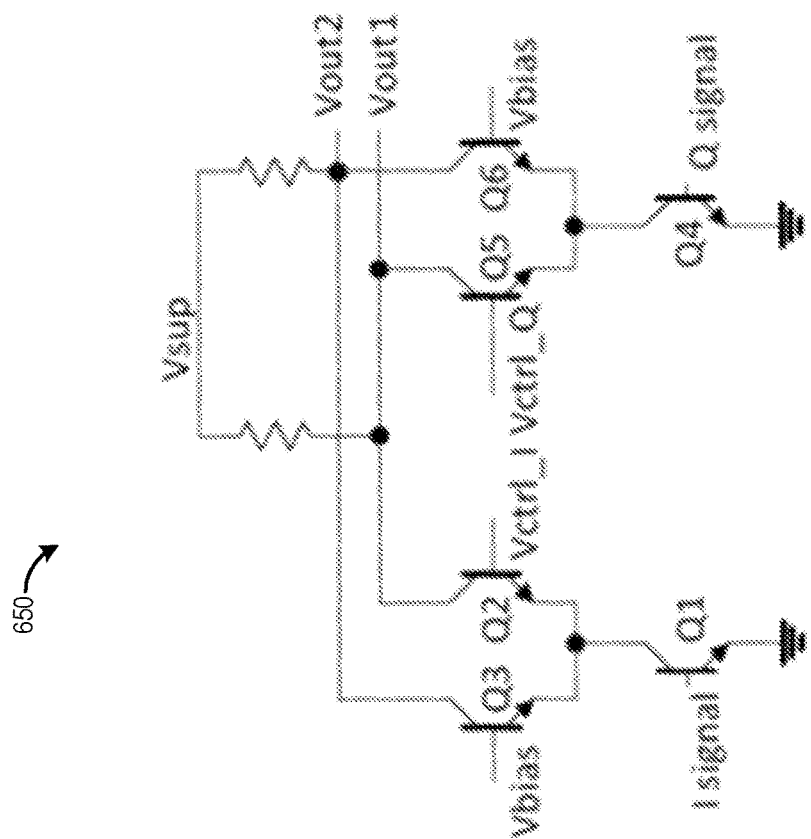
FIG. 6B illustrates an example scaling and summation circuit for a phase shifter in accordance with certain embodiments.
Figure 6A:
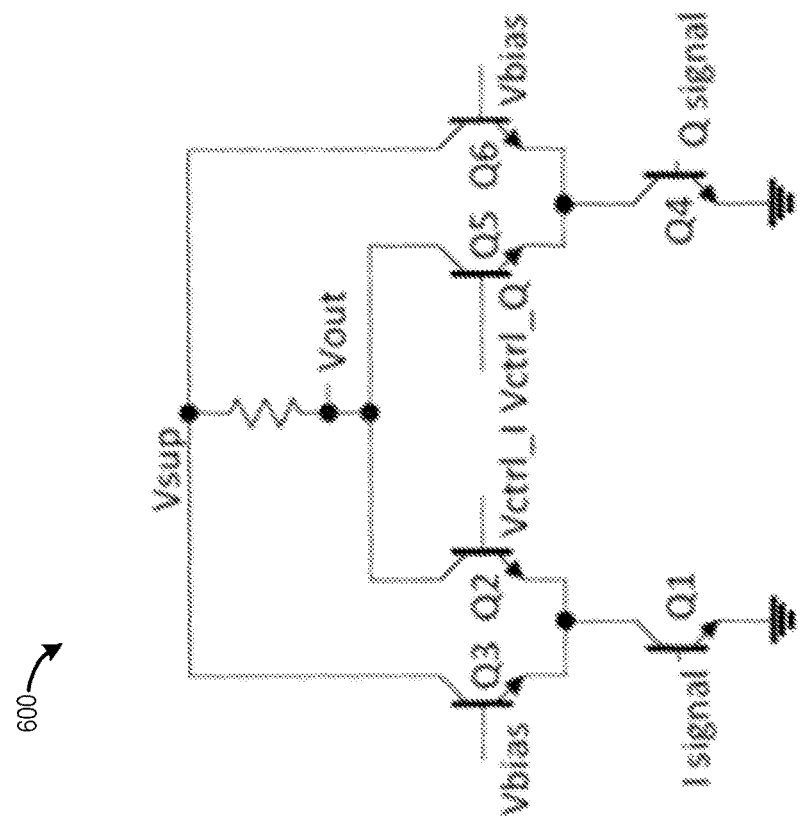
FIG. 6A illustrates an example scaling and summation circuit for a phase shifter.

FIG. 6A illustrates a non-limiting example scaling and summation circuit 600 for a phase shifter that uses a current fork. The example scaling and summation circuit 600 of FIG. 6A is an example of a single quadrant (0-90°) phase shifter. However, it should be understood that similar principles can be extended to four-quadrant (0-360°) phase shifters.

In the circuit 600, the transistors Q1, Q2, and Q3 may form a current fork. Q1 can convert the input I signal to a current and the control voltage (Vctrl_I) may determine what fraction of the current flows through Q2 and therefore, contributes to the output (Vout). In a current fork, the fraction of the input current flowing to the output may depend on how much higher the Vctrl is compared to Vbias. If you increase the control voltage, Vctrl, the amount of current flowing to Vout increases until a point is reached where all the current is provided to Vout. By adjusting the Vctrl voltage, the scaling of the I and Q components can be varied. When Vctrl_I is significantly higher than Vbias, most or all of the current flows to Q2, corresponding to a scaling factor of 1. Whether Vctrl_I is considered significantly higher than Vbias can be implementation dependent. For example, in an implementation that uses bipolar transistors, the limit may be about 300 mV. Thus, if V_ctrl_I is 300 mV higher than Vbias, then most or all of the input current may flow to the output. In certain embodiments, if the control voltage is higher, there may be little to no change in the output because all of the available current is already being provided to the output. It should be understood that the difference in the control voltage and the bias voltage that causes a particular percentage of the input current to be provided to the output current may vary based on the type of transistors and/or the implementation process used for the phase shifter 500.

When Vctrl_I is equal or substantially equal to Vbias, half of the current flows to the output Vout, and half of the current flows through Q3 to the supply Vsup, and generally does not contribute to the output. In this case, the scaling factor=0.5. On the other hand, when Vctrl_I is significantly lower than Vbias, all of the current flows to the supply Vsup and the scaling factor=0. As in the previous bipolar transistor example, a different of 300 mV may cause most or all of the current to flow to the supply Vsup. In other words, based on whether the Vctrl or the Vbias is higher, and based on the magnitude of the difference, affects the portion of the input current that is supplied to the outputs. The voltages Vctrl may be determined based on the desired angle for the phase shifter. The circuit 600 may include a similar current fork for the Q component that includes the transistors Q4, Q5, and Q6 with the difference between the control signal Vctrl_Q and Vbias being used to control the scaling factor of the Q component. In certain embodiments, the control signals Vctrl_I and Vctrl_Q may be related and/or based on the same control signal that may be supplied to a phase shifter than include the circuit 600.

In the particular implementation illustrated in FIG. 6A, part of the signal supplied to the phase shifter or the scaling and summation circuit 600 is discarded when the scaling factor is less than one. In other traditional phase shifter implementations or scaling and summation circuits of a phase shifter, anytime a scaling factor of less than 1 is applied to the signal provided to the phase shifter, a loss of signal may occur as part of the scaling process.

In certain embodiments, the summation of the I and Q components, or the scaled I and Q components, may be performed in the current domain by connecting the outputs of Q2 and Q5 together. The summed I and Q components may be output as Vout.

FIG. 6B illustrates an example scaling and summation circuit 650 for a phase shifter, such as the phase shifter 500, in accordance with certain embodiments. As with the circuit 600, the outputs of Q2 and Q5 may be summed to obtain a sum of I and Q components, Vout1. In addition, the circuit 650 can sum the outputs of Q3 and Q6 to generate a second output (Vout2) in addition to Vout1. By selecting particular scaling factors and by combining the outputs Vout1 and Vout2, such as by using a 90° hybrid in certain embodiments, a phase shifter output can be obtained that is stronger (e.g., of greater power or amplitude) than that of traditional vector-modulator-based phase shifters. The particular scaling factors may be configured by adjusting the control voltages Vctrol_I and Vctrl_Q relative to the bias voltages, Vbias. In certain embodiments, the bias voltages Vbias may be the same for both sets of transistors. In other embodiments, the Vbias applied to Q3 and the Vbias applied to Q6 may differ.

Returning to FIG. 5, the two intermediate signals Out1 and Out2 may be combined by a 90° hybrid combiner 520. The 90° combiner 520 may be inverted compared to the 90° splitter 502. Further, the 90° combiner may differ from the combining networks 516 and 518. In certain embodiments, the combining networks 516 and 518 sum the signals received at the combining networks without modifying the phase of the signals. The combiner 520 may shift the phase of one of the input signals by 90° before summing the signals. The combiner 520 may be referred to as a 90° hybrid coupler or a 90° hybrid. Out1 and Out2 may be 90° out of phase from each other by virtue of the weights selected according to equations 1-3 above. In certain embodiments, the 90° combiner may modify the phase of the signal Out2 by 90 degrees causing the phase of the signal Out2 to match the phase of the signal Out1. Thus, the signals Out1 and Out2 may be in-phase when combined, which can result in an additive effect of the signals. In some embodiments, the combined signal may be as much as double compared to the output of the phase shifter 120 or 200. As a result, in certain embodiments, the signal strength of the output signal, Out, that is output by the phase shifter 500 may be up to 3 db higher than the comparative examples of the phase shifter 120 and 200. This combination of the signals Out1 and Out2 to create an increased signal strength output signal is reflected in FIG. 7, which illustrates phasors of the intermediate signals Out1 and Out2, and the combined output signal Out. As described, in certain embodiments, the phase shifter 500 may generate an output signal of up to twice the signal strength of comparative phase shifters 120 and 200. Further, the phase shifter 500 may be less impacted by noise compared to the phase shifters 120 and 200 because, for example, of an improved signal-to-noise ratio. The improved signal strength and reduced noise of the output of the phase shifter 500 compared to the phase shifters 120 and 200 enables the phase shifter 500 to transmit and receive signals (or be included in communication paths that can transmit and receive signals) over greater distances compared to the phase shifters 120 and 200. In some embodiments, the phase shifter 500 can be implemented within the same size package as the phase shifters 120 and 200. However, in certain other embodiments, the phase shifter 500 may be larger than the phase shifters 120 and 200.

By combining Out1 and Out2 to create the output signal of the phase shifter 500, the entirety of the input signal is maintained and used to generate the output. In contrast, in certain embodiments, the output of the phase shifters 120 and/or 200 may discard or omit portions of the input signal. For example, if the scaling function X applied to the I component signal by the scaling circuit 104 is 0.7, 30% of the I component signal is discarded by the phase shifter 120. In contrast, if the scaling function X applied to the I component signal by the scaling circuit 504 is 0.7, the remaining 30% of the I component signal is maintained as I2, which is incorporated at least in part into the output signal of the phase shifter 500. Thus, the output of the phase shifter 500 may have an improved signal strength compared to the phase shifters 120 or 200.

The previous example applies the same weight (0.7) to the I component in comparing the phase shifter 120 and 500. This choice of value was to simplify the comparison. However, for a particular desired phase angle, it should be understood from the previously described equations that may be implemented by the respective scaling circuits 104 and 504, that the weight X applied to the I component will differ in at least most cases for the phase shifter 120 (or 200) and the phase shifter 500.

Although illustrated as a single circuit block, each of the scaling circuits 504 and 506 may be separate circuits or may be a single circuit implemented on the same die. Similarly, each of the elements depicted in FIG. 5 of the phase shifter 500 may be implemented on a single die or may be implemented on multiple die that are combined to form the phase shifter 500.

Further, the scaling circuits 504 and 506 may be implemented using a current fork. The scaling circuits 504 and 504 may convert a voltage corresponding to the I and Q components to a current using, for example, a common emitter or a common source amplifier. By controlling the gate or base of an additional pair of transistors or transistor networks, the current can be divided into two halve or portions. This division of the current into different portions can be representative of the application of the weights to the I and Q components of the input signal.

Figure 7:
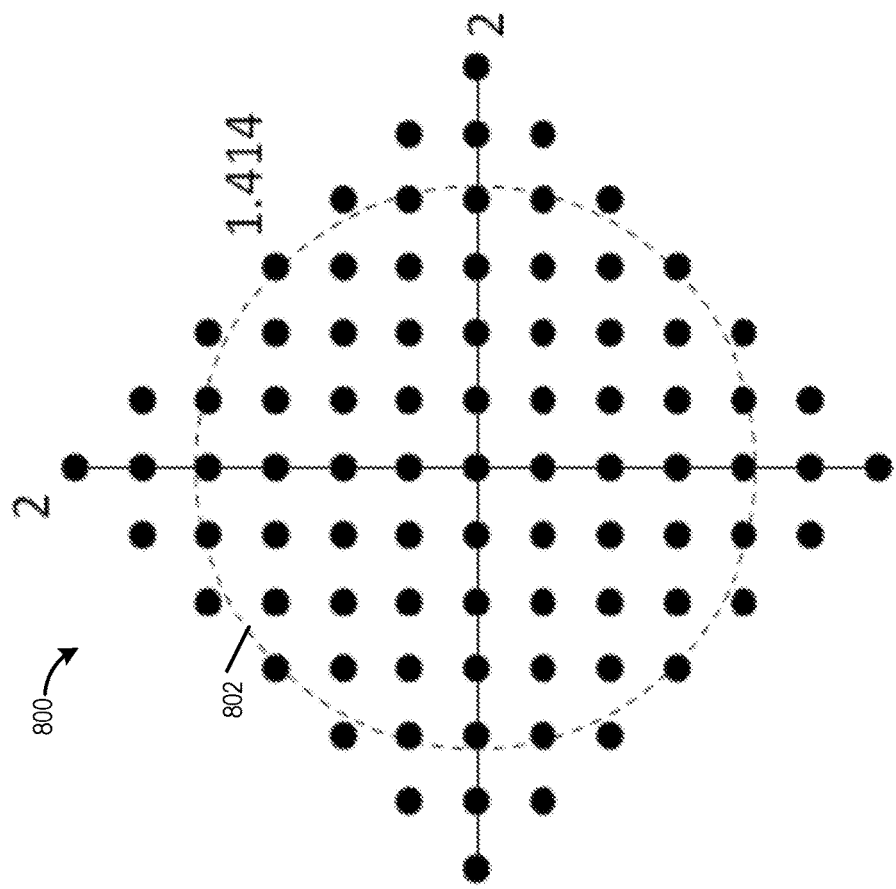
FIG. 7 presents a graph of phasors illustrating the operation of the vector modulator based phase shifter of FIG. 5.

FIG. 7 presents a graph 700 of phasors illustrating the operation of the vector modulator based phase shifter 500 of FIG. 5. The desired phase shift angle is represented by Φ. The weights X and Y applied to the I and Q components of the input signal are represented by the lines labelled X and Y, and the resultant intermediary output signal is represented by the line labelled Out1. The complementary weights X' and Y' applied to the I and Q components of the input signal are represented by the lines labelled 1–X and 1–Y, and the resultant intermediary output signal is represented by the line labelled Out2. As illustrated in FIG. 7, the resultant output signal, labelled as Out in graph 700, may be formed by rotating the second intermediate signal, Out2, by 90°, and adding the phasors together, which may result in a higher signal strength that can exceed the unit circle. Comparing the graph 700 to the graph 300, it can be determined that the strength of the signal output by the phase shifter 500 may exceed that of the phase shifters 120 and 200, which can result in a signal with an improved signal to noise ratio (SNR) compared to the phase shifters 120 and 200. This improvement can theoretically be an improvement by as much as 3 dB in gain/loss and noise figure. However, in certain embodiments, the improvement may be less due, for example, to real-world imperfections in the manufacturing process and/or stray interference or noise. For instance, implementation losses in the 90° hybrid 520 may cause the improvement to be less than 3 dB, such as 2.8 dB or 2.5 dB.

FIG. 8 presents a constellation diagram 800 of amplitudes and phases for the range of output of the vector modulator based phase shifter of FIG. 5. As can be seen by comparing the constellation of the constellation diagram 800 to that of the constellation diagram 400, the phase shifter 500 has a greater range of possible outputs that enables the phase shifter 500 to cover more amplitude and phase possibilities compared to the phase shifter 200.

Example Signal Phase Shift Process

Figure 9:
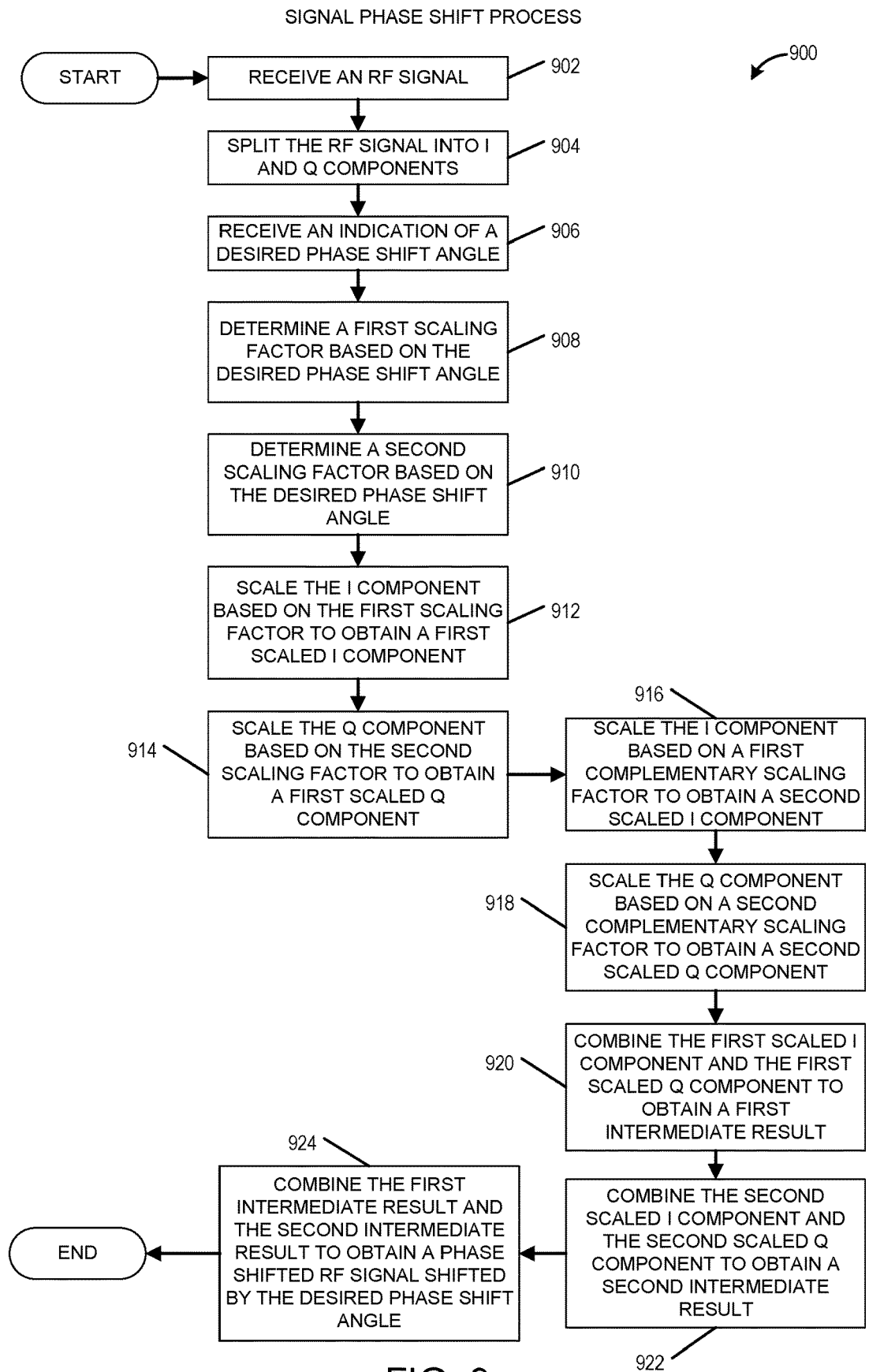
FIG. 9 illustrates a flowchart of an example signal phase shift process in accordance with certain embodiments.

FIG. 9 illustrates a flowchart of an example signal phase shift process 900 in accordance with certain embodiments. Some or all of the process 900 can be implemented by any phase shifter that can process a received signal to modify the phase of the signal without discarding portions of the signal, such as a complementary portion of the signal remaining after a signal component is weighted. The process 900, in whole or in part, can be implemented by, the phase shifter 500, or component parts thereof, and/or a controller that may be used to configured the phase shifter 500, or component parts thereof, such as the controller illustrated in FIG. 10. Although some elements of the process 900 may be implemented by a number of different systems, to simplify discussion elements of the process 900 will be described with respect to particular systems.

The process 900 begins at block 902 when, for example, the phase shifter 500 receives a radio frequency signal. The radio frequency signal may be received from an antenna, from an amplifier, from a front end module, or from any other system that may receive or transmit an RF signal. In some embodiments, the RF signal is a differential signal. In other embodiments, the RF signal is a non-differential signal whose value is determined with respect to ground instead of with respect to a complementary signal as may be the case with the differential signal. In some embodiments, the signal may be of the frequency that falls outside of the RF spectrum. For example, in certain embodiments, the signal may be within the microwave spectrum.

At block 904, the splitter 502 splits the RF signal into two orthogonal components, which may be referred to as I and Q components. Typically, the splitter 502 is a 90° phase splitter with the I component being 90° out of phase from the Q component. For example, the I component may be associated with a 0° phase and the Q component may be associated with a 90° phase. However, other phase angles may be used that maintain the 90° phase difference between the I and Q components. Further, in certain embodiments, other implementations of the splitter 502 are possible. For example, the splitter 502 may split the RF signal into a first component associated with 180° phase and a second component associated with a 270° phase.

At block 906, the phase shifter 500 receives an indication of a desired phase shift angle. The desired phase shift angle may be received from a controller that is included within a device that includes the phase shifter 500. In certain embodiments, the desired phase shift angle may be determined based at least in part on a desired direction for transmitting or receiving a signal. Further, the desired phase shift angle may be determined based at least in part on a particular antenna that is to transmit or receive the signal. In some cases, the desired phase shift angle is one of a sequence of phase shift angles provided to the phase shifter 500 so as to communicate a sequence of signals in a plurality of directions. Advantageously, in certain embodiments, using the phase shifter 500, the signals may be communicated in the plurality of directions without physically moving a device or an antenna that is part of the device. Using a phase shifter to adjust the trajectory of a communication signal can result in faster and more accurate communication compared to systems that physically move an antenna. In some embodiments, the phase shifter 500 receiving the indication of the desired phase shift angle involves the scaling circuits 504 and 506 receiving an indication of the desired phase shift angle.

In some embodiments, in addition to or instead of receiving an indication of the desired phase shift angle, the block 906 involves receiving one or more control signals corresponding to the desired phase shift angle. These control signals may control the configuration of the scaling circuits 504 and 506 so as to provide a particular scaling or weighting to the I and Q components based on the particular phase shift angle. Further, control signals may be identified by a controller based at least in part on a lookup table or other data structure that indicates particular control signals to provide to the phase shifter 500 based on a particular desired phase shift angle and/or a particular application of the phase shifter 500. For example, a shifter 500 may be configured to facilitate sweeping and RF signal across a particular space. In such an example, the controller may be configured to provide a variety of control signals to the phase shifter 500 facilitate modifying a phase of a transmission signal such that the transmission signal is transmitted at different angles and different times so as to cover the particular space.

At block 908, the scaling circuit 504 determines a first scaling factor based at least in part on the desired phase shift angle. The first scaling factor may be determined using equations one and three above. Further, the first scaling factor may be determined based at least in part on one or more control signals received by the phase shifter 500.

At block 910, the scaling circuit 506 determines a second scaling factor based at least in part on the desired phase shift angle. The second scaling factor may be determined using equations two and three above. Further, the second scaling factor may be determined based at least in part on one or more control signals received by the phase shifter 500.

At block 912, the scaling circuit 504 scales the I component based on the first scaling factor to obtain a first scaled I component, which may be referred to as I1 with reference to FIG. 5. At block 914, the scaling circuit 506 scales the Q component based on the second scaling factor to obtain a first scaled Q component, which may be referred to as Q1 with reference to FIG. 5. In some embodiments, the second scaling factor may be complementary to the first scaling factor and vice versa. For example, the second scaling factor may be one minus the first scaling factor and the first scaling factor may be one minus the second scaling factor. Thus, in certain embodiments, the first scaling factor in the second scaling factor may add up to one.

At block 916, the scaling circuit 504 scales the I component using a first complementary scaling factor that is complementary to the first scaling factor to obtain a second scaled I component, which may be referred to as I2 with reference to FIG. 5. The first complementary scaling factor may be equal to one minus the first scaling factor. In other words, if the first scaling factor has value X, the first complementary scaling factor may have value 1−X.

At block 918, the scaling circuit 504 scales the Q component using a second complementary scaling factor that is complementary to the second scaling factor to obtain a second scaled Q component, which may be referred to as Q2 with reference to FIG. 5. The second complementary scaling factor may be equal to one minus the second scaling factor.

In other words, if the first scaling factor has value Y, the first complementary scaling factor may have value 1−Y.

At block 920, the first combining network 516 combines the first scaled I component and the first scaled Q component to obtain a first intermediate result, which may be referred to as Out1 with respect to FIG. 5. At block 922, the second combining network 518 combines the second scaled I component and the second scaled Q component to obtain a second intermediate result, which may be referred to as Out2 with respect to FIG. 5.

At block 924, the 90° phase combiner 520 combines the first intermediate result on the second intermediate result to obtain a phase shifted RF signal that is shifted by the desired phase shift angle identified at the block 906. The phase shifted RF signal may be equal to the RF signal received at the block 902, but with a different phase than the signal received at the block 902.

Example Wireless Device

As previously described, the phase shifter 500 may be used in a variety of different types of applications. Further, the phase shifter 500 may be included in a variety of different types of devices. For example, the phase shifter 500 may be included in a phased array, a radar, a sonar, or a wireless device, to name a few, and any other type of device that may use a phase shifter to modify phase of the signal.

Figure 10:
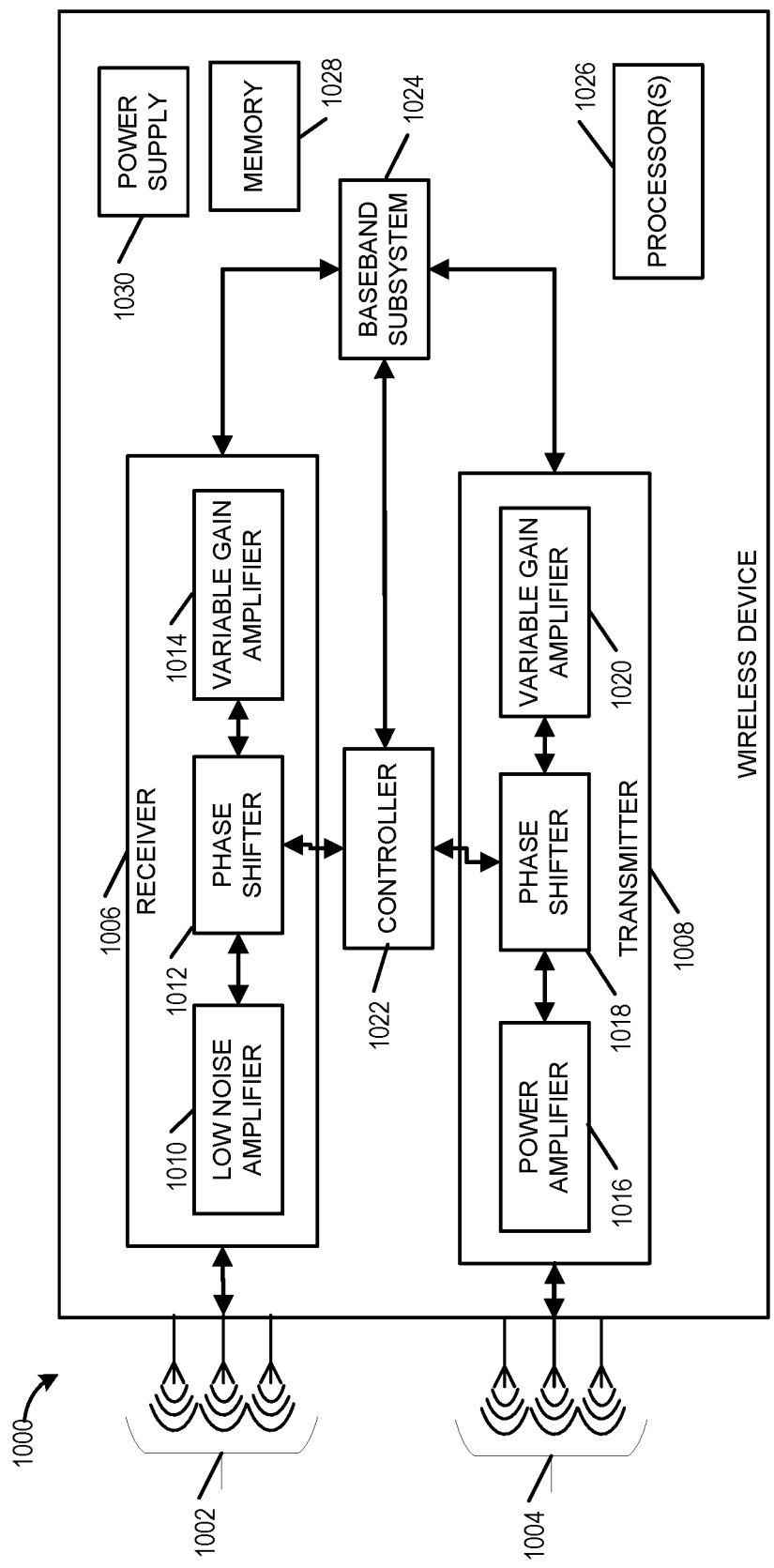
FIG. 10 illustrates a wireless device in accordance with certain embodiments.

FIG. 10 illustrates a wireless device 1000 in accordance with certain embodiments. The wireless device 1000 is but one example of a device that can include one or more phase shifters, such as the phase shifter 500. However, other types of wireless devices and other types of devices may include phase shifters as discussed in the previous paragraph.

The wireless device 1000 may include one or more antennas 1002 and 1004. For ease of illustration, the antennas 1002 are illustrated as antennas within a receive path and the antennas 1004 are illustrated as antennas within a transmit path. However, it should be understood that the wireless device 1000 may include a single antenna or a single set of antennas that function as both transmitters and receiver antennas. In other words, in certain embodiments, the antennas 1002 may receive and transmit signals, and the antennas 1004 may be omitted.

The wireless device 1000 may include a receiver 1006 and a transmitter 1008. In some embodiments, the receiver 1006 and the transmitter 1008 may be part of a transceiver (not shown). The receiver 1006 may include a number of elements or subsystems. For example, the receiver 1006 may include a low noise amplifier that receives a signal from the antennas 1002 and amplifies the received signal. This received signal may be provided to a phase shifter 1012. The phase shifter 1012 may include or may be the phase shifter 500. Further, the phase shifter 1012 may include one or more of the embodiments described with respect to the phase shifter 500.

In certain embodiments, the phase shifter 1012 adjusts the phase of a received signal by a series of step sizes so as to over a particular space or area. For example, for a radar system where the beam is typically swept across a particular space or area, the beam positions and, hence the phase shifts, may be predetermined, and the controller 1022 may cause the phase shifters 1012 to step through each of the settings associated with each of the beam positions. Similarly, the controller 1022 may cause the phase shifter 1018 to step through a series of settings to adjust beam positions for the transmitter 1008.

As another example, for a communications system, the wireless device 1000 may perform a handshake process to determine optimal or desired phase shift values for the phase shifter 1012 and/or 1018. The handshake process may be performed as part of channel state estimation, which can be performed periodically to ensure optimal operation or operation within a threshold degree of performance.

The output of the phase shifter 1012 may be provided to a variable gain amplifier 1014 or attenuator, which can amplify or attenuate the phase shifted RF signal received by the wireless device 1000. This amplified signal may be provided to a baseband subsystem 1024, which can further process the signal and/or extract information included in the signal.

The transmitter 1008 may include a similar communication path as the receiver 1006. The transmitter 1008 may include a variable gain amplifier 1020 or attenuator that receives a signal from the baseband subsystem 1024 and amplifies or attenuates the signal. This amplified signal may be provided to a phase shifter 1018 that can modify a phase of the signal. The phase of the signal may be modified based at least in part on a desired antenna 1004 that is to transmit the signal or a desired direction within which the signal is to be transmitted. As with the phase shifter 1012, the phase shifter 1018 may be or may include the phase shifter 500. Further, the phase shifter 1018 may include one or more of the embodiments described with respect to the phase shifter 500. The phase shifted signal may be provided to a power amplifier 1016 which can amplify the phase shifted signal before it is provided to an antenna 1004 for transmission.

In certain embodiments, the wireless device 1000 may include a controller 1022 that can control the phase shifters 1012 and/or 1018. The controller 1022 may control the phase shifters 1012 and/or 1018 by configuring one or more scaling circuits of the phase shifters 1012 and/or 1018. In some embodiments, the controller 1022 may control the phase shifters 1012 and/or 1018 by providing an indication of a particular phase angle to the phase shifters 1012 and/or 1018. This indication of the particular phase angle may be used by the phase shifters 1012 and/or 1018 to modify the phase of an input signal provided to the phase shifters 1012 and/or 1018. In some embodiments, the controller 1022 may configure the phase shifters 1012 and/or 1018 based on a control signal provided to the controller 1022. The control signal provided to the controller 1022 may be received from the baseband subsystem 1024 and/or from a base station in communication with the wireless device 1000.

In certain embodiments, the wireless device 1000 may include one or more additional systems or subsystems that facilitate operation of the wireless device 1000. For example, the wireless device 1000 may include one or more processors 1026, such as central or main processors, digital signal processors, or graphics processors. These processors 1026 may process information that is received from the receiver 1006 or that is provided to the transmitter 1008. Further, the wireless device 1000 may include memory 1028 to facilitate processing of data. In addition, the wireless device 1000 may include a power supply 1030, which may provide power to one or more elements of the wireless device 1000. The power supply 1030 may be a battery. Further, the power supply 1030 may include one or more converters for converting AC to DC from a mains power supply.

Additional Example Use Cases

Figure 11:
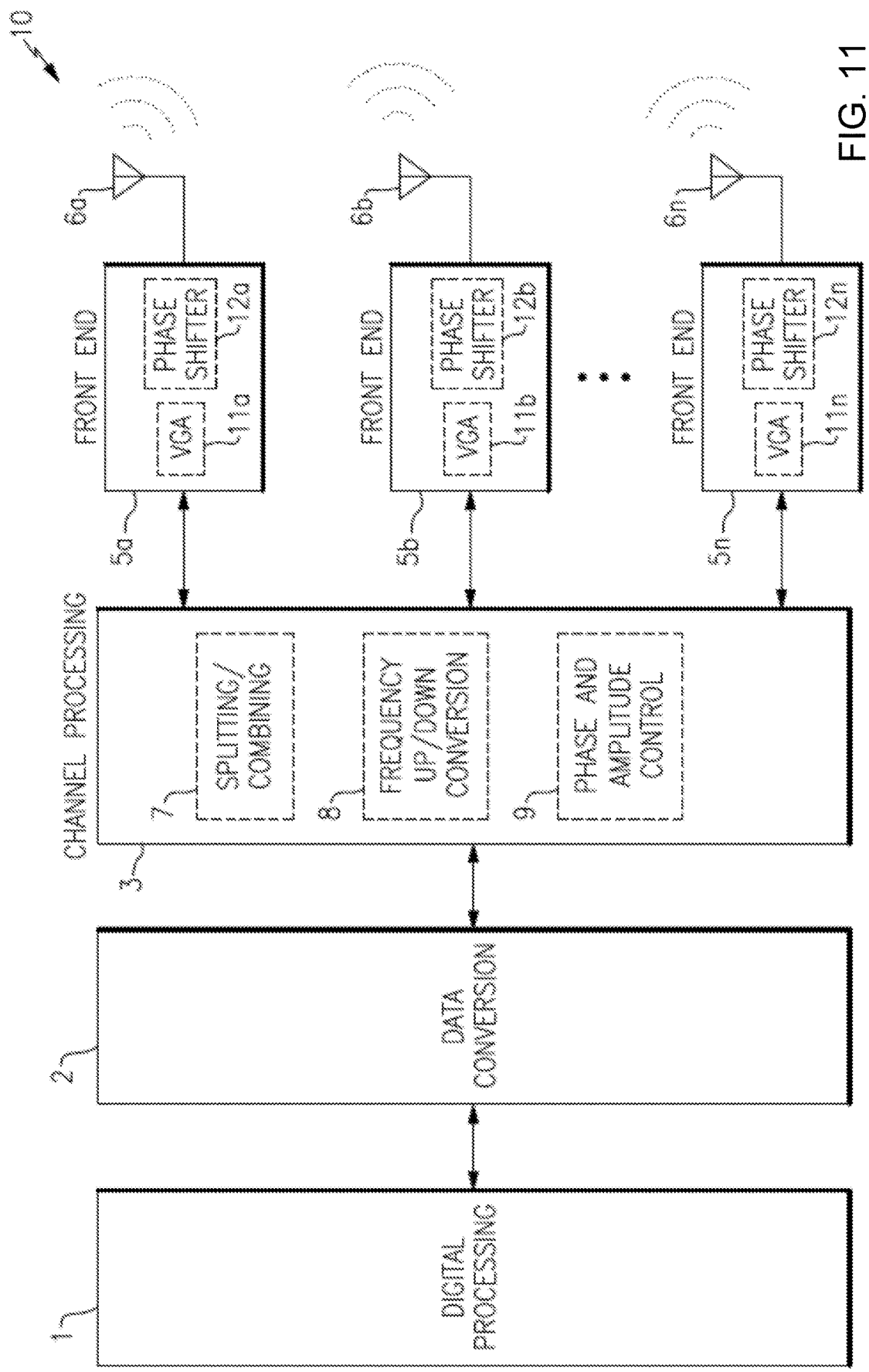
FIG. 11 is a schematic diagram of one embodiment of a phased array antenna system including phase shifters and variable gain amplifiers (VGAs).

Phase shifters, including embodiments described herein, such as the phase shifter 500, can be used in one or more front-end modules as part of a phased array antenna system. FIG. 11 is a schematic diagram of one embodiment of a phased array antenna system 10 including phase shifters and variable gain amplifiers (VGAs). The phased array antenna system 10 includes a digital processing circuit 1, a data conversion circuit 2, a channel processing circuit 3, RF front ends 5a, 5b, ... 5n, and antennas 6a, 6b, ... 6n. Although an example with three RF front ends and three antennas is illustrated, the phased array antenna system 10 can include more or fewer RF front ends and/or more or fewer antennas as indicated by the ellipses. Furthermore, in certain implementations, the phased array antenna system 10 is implemented with separate antennas for transmitting and receiving signals.

The phased array antenna system 10 illustrates one embodiment of an electronic system that can include one or more phase shifters implemented in accordance with the teachings herein. However, the phase shifters disclosed herein can be used in a wide range of electronics. A phased array antenna system is also referred to herein as an active electronically scanned array.

As shown in FIG. 11, the channel processing circuit 3 is coupled to antennas 6a, 6b, ... 6n through RF front ends 5a, 5b, ... 5n, respectively. The channel processing circuit 3 includes a splitting/combining circuit 7, a frequency up/down conversion circuit 8, and a phase and amplitude control circuit 9, in this embodiment. The channel processing circuit 3 provides RF signal processing of RF signals transmitted by and received from each communication channel. In the illustrated embodiment, each communication channel is associated with a corresponding RF front end and antenna.

With continuing reference to FIG. 11, the digital processing circuit 1 generates digital transmit data for controlling a transmit beam radiated from the antennas 6a, 6b, ... 6n. The digital processing circuit 1 also processes digital receive data representing a receive beam. In certain implementations, the digital processing circuit 1 includes one or more baseband processors.

As shown in FIG. 11, the digital processing circuit 1 is coupled to the data conversion circuit 2, which includes digital-to-analog converter (DAC) circuitry for converting digital transmit data to one or more baseband transmit signals and analog-to-digital converter (ADC) circuitry for converting one or more baseband receive signals to digital receive data.

The frequency up/down conversion circuit 8 provides frequency upshifting from baseband to RF and frequency downshifting from RF to baseband, in this embodiment. However, other implementations are possible, such as configurations in which the phased array antenna system 10 operates in part at an intermediate frequency (IF). In certain implementations, the splitting/combining circuit 7 provides splitting to one or more frequency upshifted transmit signals to generate RF signals suitable for processing by the RF front ends 5a, 5b, ... 5n and subsequent transmission on the antennas 6a, 6b, ... 6n. Additionally, the splitting/combining circuit 7 combines RF signals received vias the antennas 6a, 6b, ... 6n and RF front ends 5a, 5b, ... 5n to generate one or more baseband receive signals for the data conversion circuit 2.

The channel processing circuit 3 also includes the phase and amplitude control circuit 9 for controlling beamforming operations. For example, the phase and amplitude control circuit 9 controls the amplitudes and phases of RF signals transmitted or received via the antennas 6a, 6b, ... 6n to provide beamforming. With respect to signal transmission, the RF signal waves radiated from the antennas 6a, 6b, ... 6n aggregate through constructive and destructive interference to collectively generate a transmit beam having a particular direction. With respect to signal reception, the channel processing circuit 3 generates a receive beam by combining the RF signals received from the antennas 6a, 6b, ... 6n after amplitude scaling and phase shifting.

Phased array antenna systems are used in a wide variety of applications including, but not limited to, mobile communications, military and defense systems, and/or radar technology.

As shown in FIG. 11, the RF front ends 5a, 5b, ... 5n each include one or more VGAs 11a, 11b, ... 11n, which are used to scale the amplitude of RF signals transmitted or received by the antennas 6a, 6b, ... 6n, respectively. Additionally, the RF front ends 5a, 5b, ... 5n each include one or more phase shifters 12a, 12b, ... 12n for phase-shifting the RF signals. For example, in certain implementations the phase and amplitude control circuit 9 generates gain control signals for controlling the amount of gain provided by the VGAs 11a, 11, ... 11n and phase control signals for controlling the amount of phase shifting provided by the phase shifters 12a, 12b, ... 12n. The phase shifters 12a, 12b, ... 12n can include one or more embodiments described herein with respect to the phase shifter 500.

The phased array antenna system 10 operates to generate a transmit beam or receive beam including a main lobe pointed in a desired direction of communication. The phased array antenna system 10 realizes increased signal to noise (SNR) ratio in the direction of the main lobe. The transmit or receive beam also includes one or more side lobes, which point in different directions than the main lobe and are undesirable.

An accuracy of beam direction of the phased array antenna system 10 is based on a precision in controlling the phases of the RF signals communicated via the antennas 6a, 6b, ... 6n. For example, when one or more of the RF signals has a large phase error, the beam can be broken and/or pointed in an incorrect direction. Furthermore, the size or magnitude of beam side lobe levels is based on an accuracy in controlling the amplitude of the RF signals.

Accordingly, it is desirable to tightly control the phase and amplitude of RF signals communicated by the antennas 6a, 6b, ... 6n to provide robust beamforming operations.

By implementing the phase shifters 12a, 12b, ... 12n in accordance with the teachings herein, a number of benefits can be achieved, including, but not limited to, lower signal loss in transmit and receive paths, thereby leading to an enhancement in transmit power and/or receiver sensitivity. Thus, the phase shifters herein are suitable for providing phase control in phased array antenna systems as well as other applications.

Figure 12A:
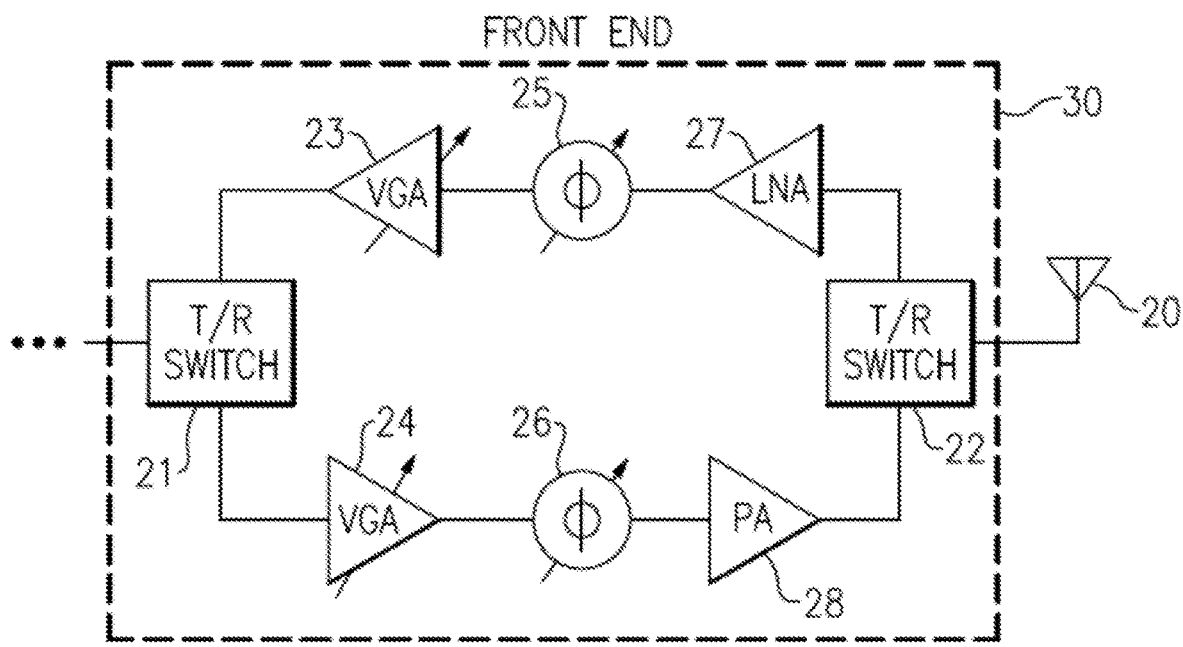
FIG. 12A is a schematic diagram of one embodiment of a front end system including phase shifters and VGAs.

FIG. 12A is a schematic diagram of one embodiment of a front end system 30 including phase shifters and VGAs. The front end system 30 includes a first transmit/receive (T/R) switch 21, a second transmit/receive switch 22, a receive-path VGA 23, a transmit-path VGA 24, a receive-path controllable phase shifter 25, a transmit-path phase shifter 26, a low noise amplifier (LNA) 27, and a power amplifier (PA) 28. As shown in FIG. 12A, the front end system 30 is depicted as being coupled to the antenna 20.

The front end system 30 can be included in a wide variety of RF systems, including, but not limited to, phased array antenna systems, such as the phased array antenna system 10 of FIG. 11. For example, multiple instantiations of the front end system 30 can be used to implement the RF front ends 5a, 5b, ... 5n of FIG. 11. In certain implementations, one or more instantiations of the front end system 30 are fabricated on a semiconductor die or chip.

As shown in FIG. 12A, the front end system 30 includes the receive-path VGA 23 for controlling an amount of amplification provided to an RF input signal received on the antenna 20, and the transmit-path VGA 24 for controlling an amount of amplification provided to an RF output signal transmitted on the antenna 20. Additionally, the receive-path controllable phase shifter 25 controls an amount of phase shifting provided to the RF input signal, and the transmit-path phase shifter 26 controls an amount of phase shifting providing the RF output signal.

RF systems, such as the front end system 30 of FIG. 12A, can include one or more phase shifters for controlling the phase shift provided to RF signals propagating along transmit paths and/or receive paths. Although one example of an RF system including phase shifters is shown, the teachings herein are applicable to RF systems implemented in a wide variety of ways.

Figure 12B:
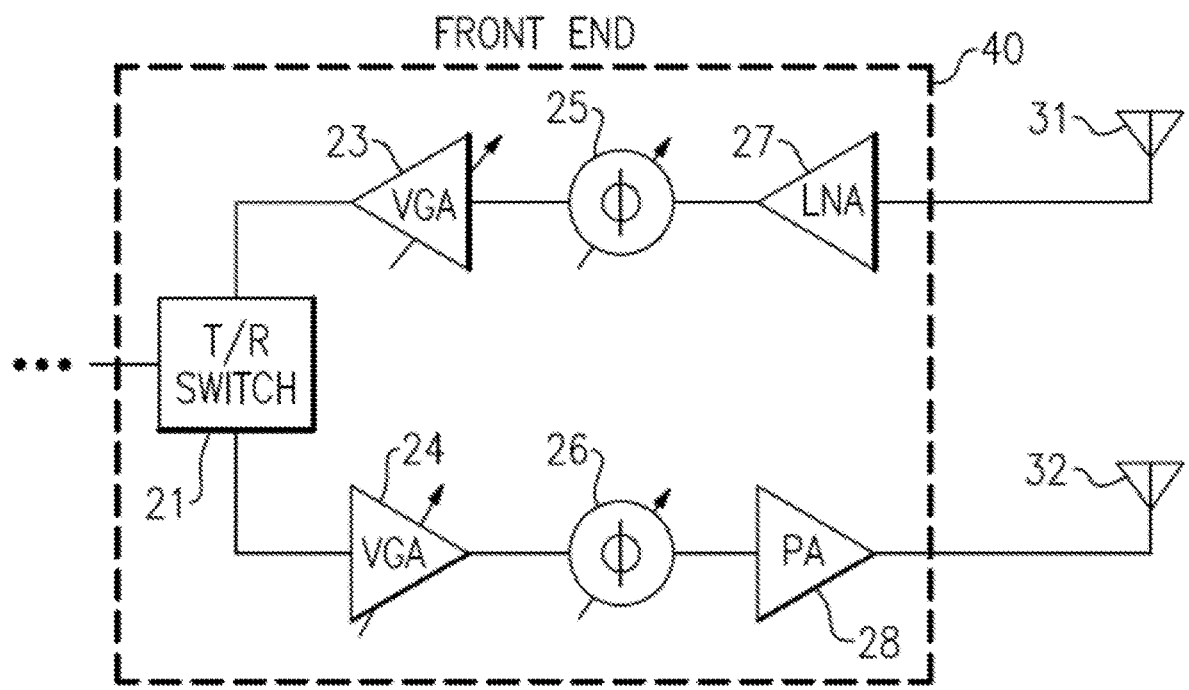
FIG. 12B is a schematic diagram of another embodiment of a front end system including phase shifters and VGAs.

FIG. 12B is a schematic diagram of another embodiment of a front end system 40 including VGAs. The front end system 40 of FIG. 12B is similar to the front end system 30 of FIG. 2A, except that the front end system 40 omits the second transmit/receive switch 22. As shown in FIG. 12B, the front end system 40 is depicted as being coupled to a receive antenna 31 and to a transmit antenna 32.

The front end system 40 operates with different antennas for signal transmission and reception. In the illustrated embodiment, the receive-path controllable phase shifter 25 controls an amount of phase shift provided to an RF input signal received on the receive antenna 31, and the transmit-path phase shifter 26 controls an amount of phase shift provided to an RF output signal transmitted on the second antenna 32.

Certain RF systems include separate antennas for transmission and reception of signals.

TERMINOLOGY AND CONCLUSION

Principles and advantages discussed herein can be used in any device that can change the phase of a signal. Further, embodiments disclosed herein can improve the signal strength and reduce the impact of noise on a phase-shifted signal.

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

Some or all of any the processes described herein may be embodied in, and fully automated via, software code modules executed by a computing system that includes one or more computers or processors. The code modules may be stored in any type of non-transitory computer-readable medium or other computer storage device. Some or all the methods may be embodied in specialized computer hardware.

Many other variations than those described herein will be apparent from this disclosure. For example, depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or through multiple processors or processor cores or on other parallel architectures, rather than sequentially. In addition, different tasks or processes can be performed by different machines and/or computing systems that can function together.

The various illustrative logical blocks and modules described in connection with the embodiments disclosed herein can be implemented or performed by a machine, such as a processing unit or processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor can be a microprocessor, but in the alternative, the processor can be a controller, microcontroller, or state machine, combinations of the same, or the like. A processor can include electrical circuitry configured to process computer-executable instructions. In another embodiment, a processor includes an FPGA or other programmable device that performs logic operations without processing computer-executable instructions. A processor can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor may also include primarily analog components. For example, some or all of the signal processing algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Any process descriptions, elements or blocks in the flow diagrams described herein and/or depicted in the attached figures should be understood as potentially representing modules, segments, or portions of code which include one or more executable instructions for implementing specific logical functions or elements in the process. Alternate implementations are included within the scope of the embodiments described herein in which elements or functions may be deleted, executed out of order from that shown, or discussed, including substantially concurrently or in reverse order, depending on the functionality involved as would be understood by those skilled in the art.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A phase shifter with signal loss compensation, the phase shifter comprising:
    a splitter configured to split an input signal into a first component signal and a second component signal that has a 90 degree phase difference from the first component signal;
    scaling circuitry configured to:
    split the first component signal into a first I signal and a second I signal;
    scale the first I signal by a first scaling factor to obtain a first scaled I signal and the second I signal by a second scaling factor to obtain a second scaled I signal, wherein the second scaling factor is complementary to the first scaling factor;
    output the first scaled I signal along a first signal path and the second scaled I signal along a second signal path;
    split the second component signal into a first Q signal and a second Q signal;
    scale the first Q signal by a third scaling factor to obtain a first scaled Q signal and the second Q signal by a fourth scaling factor to obtain a second scaled Q signal, wherein the fourth scaling factor is complementary to the third scaling factor, and
    output the first scaled Q signal along a third signal path and the second scaled Q signal along a fourth signal path; and
    combining circuitry configured to combine the first scaled I signal, the first scaled Q signal, the second scaled I signal, and the second scaled Q signal to generate an output signal corresponding to a phase-shifted version of the input signal.

2. The phase shifter of claim 1, wherein a magnitude of the second scaling factor is substantially equal to one minus a magnitude of the first scaling factor and a magnitude of the fourth scaling factor is substantially equal to one minus a magnitude of the third scaling factor.

3. The phase shifter of claim 1, wherein a magnitude of the first scaling factor is substantially equal to a magnitude of the fourth scaling factor and a magnitude of the third scaling factor is substantially equal to a magnitude of the second scaling factor.

4. The phase shifter of claim 1, wherein the input signal comprises a differential signal.

5. The phase shifter of claim 1, further comprising a signal inverter configured to modify a polarity of at least one of the first scaled I signal, the second scaled I signal, the first scaled Q signal, or the second scaled Q signal.

6. The phase shifter of claim 1, wherein a sign of the first scaled I signal and a sign of the second scaled Q signal are determined based on a sign of a horizontal component of a desired phase shifter output vector, and wherein a sign of the second scaled I signal and a sign of the first scaled Q signal are determined based on a sign of a vertical component of a desired phase shifter output vector.

7. The phase shifter of claim 1, wherein the scaling circuitry comprises an attenuator or a current fork.

8. The phase shifter of claim 1, wherein the combining circuitry comprises:
    first combining circuitry configured to combine the first scaled I signal and the first scaled Q signal to generate a first aggregate signal;
    second combining circuitry configured to combine the second scaled I signal and the second scaled Q signal to generate a second aggregate signal; and
    third combining circuitry configured to combine the first aggregate signal and the second aggregate signal to generate the output signal.

9. The phase shifter of claim 8, wherein at least the third combining circuitry comprises a quadrature phase shift network.

10. The phase shifter of claim 8, wherein the third combining circuitry comprises a 90 degree combiner configured to generate the output signal.

11. A method of compensating for signal loss when modifying a phase of an input signal using a phase shifter, the method comprising:
    splitting an input signal into a first component signal and a second component signal;
    splitting the first component signal into a first in-phase (I) signal and a second I signal;
    scaling the first I signal by a first scaling factor to obtain a first scaled I signal and the second I signal by a second scaling factor to obtain a second scaled I signal, wherein the second scaling factor is complementary to the first scaling factor;
    outputting the first scaled I signal along a first signal path and the second scaled I signal along a second signal path;
    splitting the second component signal into a first quadrature phase (Q) signal and a second Q signal;
    scaling the first Q signal by a third scaling factor to obtain a first scaled Q signal and the second Q signal by a fourth scaling factor to obtain a second scaled Q signal, wherein the fourth scaling factor is complementary to the third scaling factor;
    outputting the first scaled Q signal along a third signal path and the second scaled Q signal along a fourth signal path; and
    combining the first scaled I signal, the first scaled Q signal, the second scaled I signal, and the second scaled I signal to obtain an output signal, wherein the output signal comprises a phase-shifted version of the input signal.

12. The method of claim 11, wherein the first scaling factor and the second scaling factor substantially add to one, and the third scaling factor and the fourth scaling factor substantially add to one.

13. The method of claim 11, wherein the first scaling factor and the fourth scaling factor are substantially the same, and the second scaling factor and the third scaling factor are substantially the same.

14. The method of claim 11, further comprising determining the first scaling factor based at least in part on a desired phase shift angle.

15. The method of claim 14, further comprising determining the desired phase shift angle based at least in part on a control signal received at the phase shifter.

16. The method of claim 11, further comprising inverting a polarity of the first scaled I signal to obtain a first inverted signal, and combining the first inverted signal with the first scaled Q signal or an inverted version of the first scaled Q signal.

17. A wireless device configured to transmit and receive radio frequency (RF) signals, the wireless device comprising:
   an antenna array comprising one or more antennas configured to transmit an RF signal; and
   a transmitter configured to generate the RF signal for transmission by the antenna array, the transmitter comprising a phase shifter configured to modify a phase of a communication signal,
   wherein the phase shifter comprises:
   a splitter configured to split the communication signal into an in-phase (I) signal and a quadrature-phase (Q) signal;
   scaling circuitry configured to:
   generate a first scaled I signal and a second scaled I signal by splitting the I signal into a first I signal component and a second I signal component, and scaling the first I signal component by a first scaling factor and scaling the second I signal component by a second scaling factor,
   wherein the second scaling factor is complementary to the first scaling factor;
   output the first scaled I signal along a first signal path and the second scaled I signal along a second signal path;
   generate a first scaled Q signal and a second scaled Q signal by splitting the Q signal into a first Q signal component and a second Q signal component, and scaling the first Q signal component by a third scaling factor and scaling the second Q signal component by a fourth scaling factor, wherein the fourth scaling factor is complementary to the third scaling factor; and
   output the first scaled Q signal along a third signal path and the second scaled Q signal along a fourth signal path; and
   combining circuitry configured to combine the first scaled I signal, the first scaled Q signal, and the second scaled I signal, and the second scaled Q signal to generate a phase-shifted version of the communication signal.

18. The wireless device of claim 17, wherein the transmitter further comprises a power amplifier configured to amplify the phase-shifted version of the communication signal to obtain the RF signal, and wherein the transmitter provides the RF signal to the antenna array for transmission.

19. The wireless device of claim 17, further comprising a receiver configured to receive a second RF signal, wherein the receiver comprises:
   a low noise amplifier configured to amplify the second RF signal to obtain an amplified second RF signal; and
   a second phase shifter configured to receive the amplified second RF signal as an input signal and to generate a phase-shifted version of the amplified second RF signal.

20. The wireless device of claim 17, further comprising a controller configured to provide a control signal corresponding to a phase shift angle to the phase shifter, and wherein at least the first scaling factor is determined based at least in part on the control signal corresponding to the phase shift angle.

* * * * *